(12) United States Patent
Miao et al.

(10) Patent No.: US 9,064,873 B2
(45) Date of Patent: Jun. 23, 2015

(54) SINGULATED SEMICONDUCTOR STRUCTURE

(71) Applicant: TAIWAN SEMICONDUCTOR MANUFACTURING COMPANY LTD., Hsinchu (TW)

(72) Inventors: Chia-Chun Miao, Hsinchu County (TW); Shih-Wei Liang, Taichung County (TW); Kai-Chiang Wu, Hsinchu (TW); Ming-Kai Liu, New Taipei (TW); Yen-Ping Wang, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 13/954,552

(22) Filed: Jul. 30, 2013

(65) Prior Publication Data

US 2015/0035161 A1    Feb. 5, 2015

(51) Int. Cl.
| | | |
|---|---|---|
| H01L 23/48 | (2006.01) | |
| H01L 23/52 | (2006.01) | |
| H01L 29/40 | (2006.01) | |
| H01L 23/528 | (2006.01) | |
| H01L 21/768 | (2006.01) | |
| H01L 23/544 | (2006.01) | |

(52) U.S. Cl.
CPC ...... *H01L 23/5283* (2013.01); *H01L 21/76883* (2013.01); *H01L 23/544* (2013.01)

(58) Field of Classification Search
CPC .............. H01L 23/5283; H01L 21/76883; H01L 23/48
USPC ........... 257/774, 777, E21.506; 438/118, 126
See application file for complete search history.

(56) References Cited

U.S. PATENT DOCUMENTS

| | | | |
|---|---|---|---|
| 7,112,889 B1 | 9/2006 | Maruyama | |
| 2005/0136571 A1* | 6/2005 | Guenther | 438/124 |
| 2009/0146284 A1* | 6/2009 | Kim et al. | 257/686 |
| 2011/0233753 A1* | 9/2011 | Camacho et al. | 257/692 |
| 2012/0276334 A1* | 11/2012 | Fedynyshyn et al. | 428/141 |
| 2013/0037929 A1* | 2/2013 | Essig et al. | 257/693 |
| 2013/0075902 A1* | 3/2013 | Chow et al. | 257/737 |
| 2014/0001635 A1* | 1/2014 | Chen et al. | 257/751 |
| 2014/0168014 A1* | 6/2014 | Chih et al. | 343/700 MS |

* cited by examiner

*Primary Examiner* — Phuc Dang
(74) *Attorney, Agent, or Firm* — WPAT, P.C.; Anthony King

(57) ABSTRACT

A singulated semiconductor structure comprises a molding compound; a first conductive post in the molding compound having a first geometric shape in a top view; a second conductive post or an alignment mark in the molding compound having a second geometric shape in a top view, wherein the second geometric shape is different from the first geometric shape. The second conductive post or an alignment mark can be positioned at the corner, the center, the edge, or the periphery of the singulated semiconductor structure. The second geometric shape can be any geometric construct distinguishable from the first geometric shape. The second conductive post or an alignment mark can be placed at an active area or a non-active area of the singulated semiconductor structure.

20 Claims, 16 Drawing Sheets

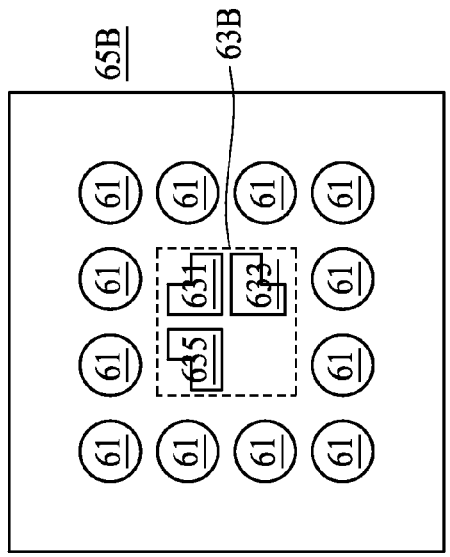
FIG. 6A
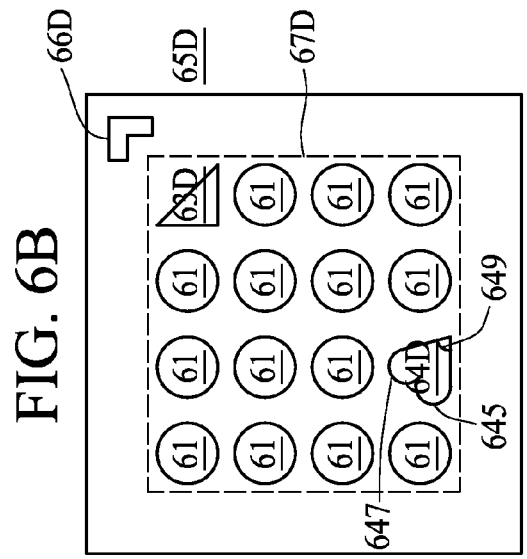
FIG. 6B
FIG. 6D
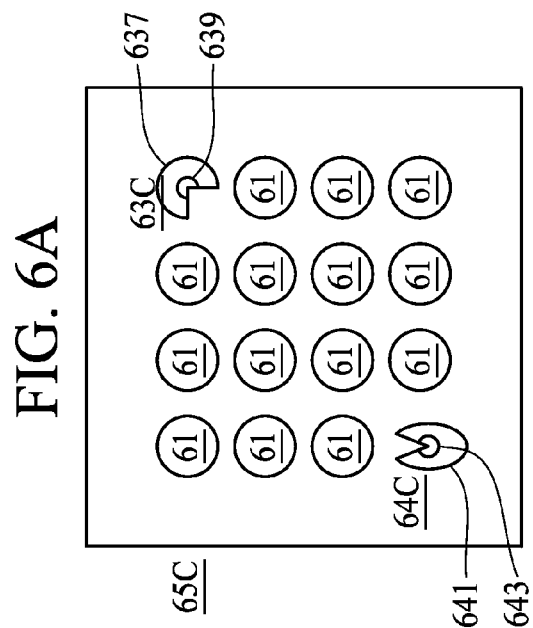
FIG. 6C

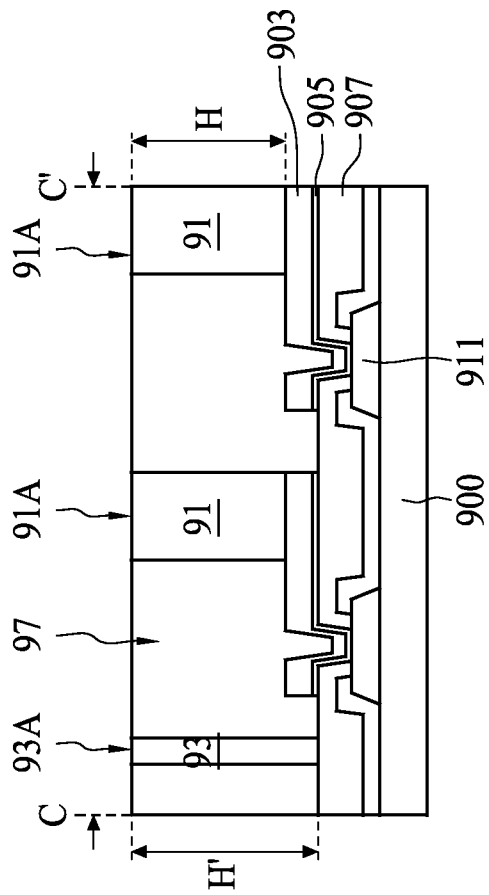
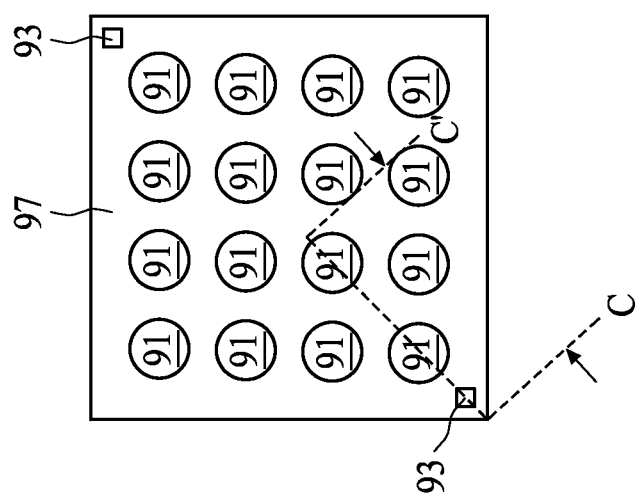
FIG. 9B
FIG. 9A

SINGULATED SEMICONDUCTOR STRUCTURE

FIELD

The present disclosure relates to a singulated semiconductor structure.

BACKGROUND

Wafer Level Packaging (WLP) refers to the technology of packaging an integrated circuit (IC) at a wafer level, instead of the traditional process of assembling the package of each individual die on individual packages. One feature of the WLP is that the resulting integrated circuit package is practically the same size as the individual package diced. Furthermore, WLP provides a streamlining of the semiconductor manufacturing process from start to customer shipment.

After forming the package on the wafer level, a single processed package wafer in WLP is separated into individual packages with finished interconnection and device protection over the die or dies. This separation process is called singulation and is typically carried out by a mechanical or laser saw traversing through the narrow bands between adjacent packages.

Passing the mechanical or laser saw through the narrow bands exerts mechanical stresses to the package wafer. The saw-cut induced stresses can variously manifest as cracking, chipping, flaking, peeling, and/or delamination of the layered semiconductor materials at the edges of the dies or chips. Other issues such as cutting precision also adversely affects package reliability and production yield. The problem is more acute in WLP because most of the integration or packaging steps are completed before singulation, any mis-operation or structural damage at this point wastes cost and effort of all preceding steps. Improvements on methods or structural design which increase the yield of singulation continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6A to FIG. 6D are top views of singulated packages which include some first conductive posts or a conductive post array and at least one second conductive post or alignment mark according to some embodiments of the present disclosure;

FIG. 9A is a top view of a singulated package having some first conductive posts or a conductive post array and two second conductive posts or alignment marks according to some embodiments of the present disclosure;

FIG. 9B is the cross sectional view along line CC' in FIG. 9A according to some embodiments of the present disclosure;

DETAILED DESCRIPTION OF THE INVENTION

Figure 1:
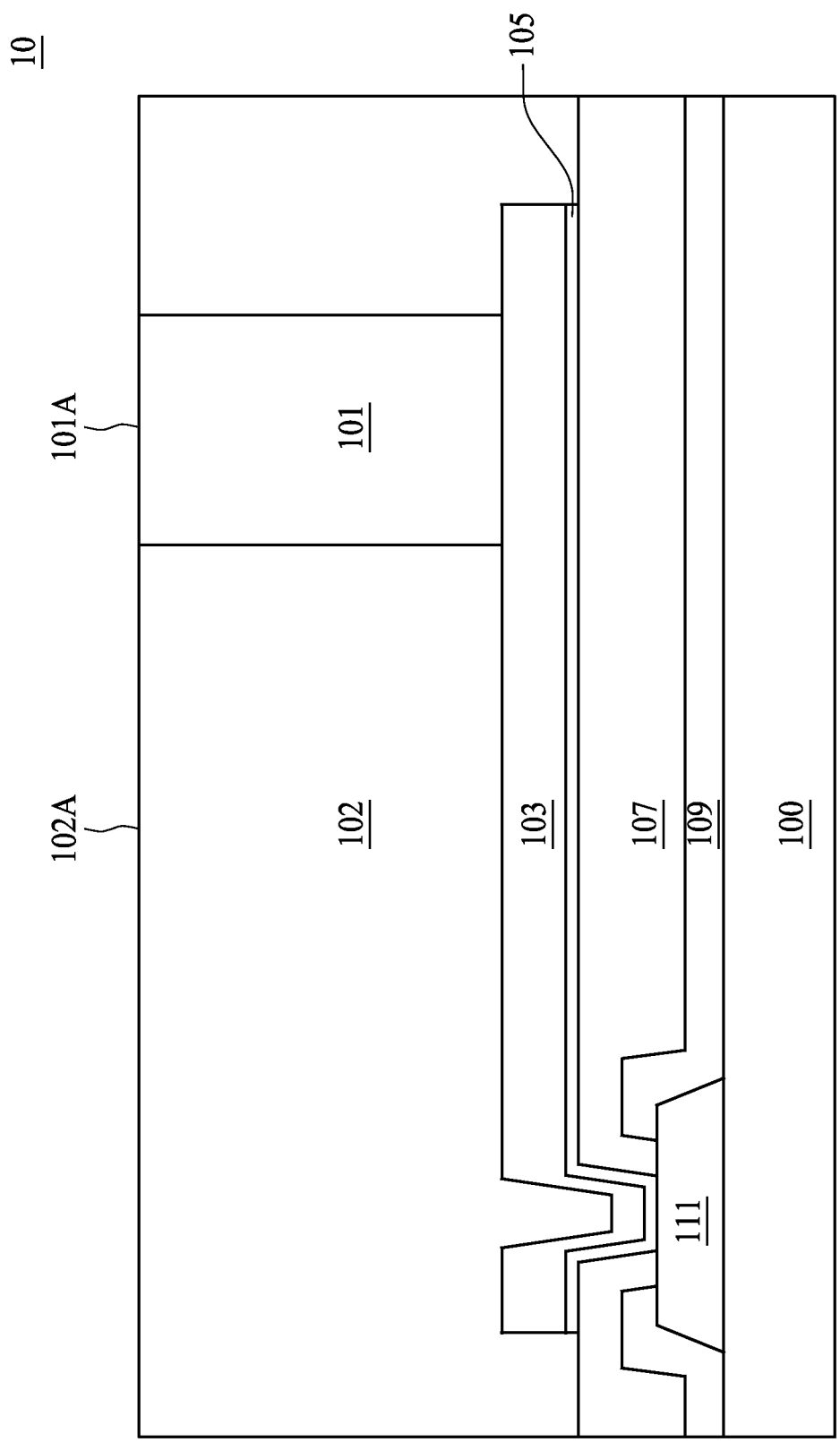
FIG. 1 is a cross sectional view of a package prepared by wafer level packaging operation according to some embodiments of the present disclosure.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

When the semiconductor package is separated, or singulated, a singulation machine cuts along the scribe lines between packages on a substrate. In order to achieve a high manufacturing yield, the singulation machine uses some specific feature patterns to precisely identify and detect the scribe line. The specific feature pattern is to be distinguished from adjacent patterns to facilitate the identification operation.

In the present disclosure, a distinguishable pattern structure is disposed on a to-be-singulated substrate. Viewing from the top, the distinguishable pattern structure has a geometric shape that is distinguishable from that of the adjacent feature patterns. The distinguishable pattern structure guides the singulation machine to precisely register the position of a predefined scribe line. In some embodiments, the distinguishable pattern structure is a conductive post disposed on a redistribution layer (RDL). A method of manufacturing the distinguishable pattern structure is also disclosed in the present disclosure.

In describing and claiming the present disclosure, the following terminology will be used in accordance with the definitions set forth below.

As used herein, "conical shape" refers to a circle, an oval, an ellipse, or any two dimensional geometric construct which forms the section of a three dimensional cone having a closed perimeter.

In the present disclosure, an active area performs the actual computing and storage operations of the chip. The non-active area herein is not limited to specific regions within a package because whether the position forming an electrical conductive path connected to the active structure depends on the electrical routing design in individual WLP structure. As used herein, a "non-active area" refers to a position which does not form any electrical conductive path connected to the physical part of a package that contains the transistors, resistors and capacitors. For example, the non-active area may be within scribe lines of a package wafer.

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, "molding compound" refers to a compound formed with composite materials. A molding compound may include epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

As used herein, "electrical interconnects" refers to conductive lines or films routed inside the IC structure over and around the die or dies. In some embodiments, the electrical interconnects are redistribution layers (RDL). The RDLs are used for a fan-in or a fan-out process. In some embodiments, the electrical interconnects are formed with a conductive material such as gold, silver, copper, nickel, tungsten, aluminum, and/or alloys thereof.

As used herein, a "conductive post" refers to a conductive filled via or a conductive plug that is disposed on a carrier, a substrate, or embedded in a molding compound. The conductive filled via or a conductive plug is arranged to extend to a top surface of the package or the molding compound. Conductive posts may provide an electrical communication between a top surface and a bottom surface of the package or provide an electrical communication between a top surface of the package to a die in the package.

As used herein, a "contact pad" is disposed on a top surface of a die. A top surface of the contact pad may receive a solder ball or solder paste and acts as a terminal to connect the die to an external circuit or electrically connects to an RDL. A bottom surface of the contact pad is either connected to an interconnect, such as an RDL, or to an active area in the die. In some embodiments, the contact pad is an under bump metallization (UBM). In some embodiments, the UBM is formed with a conductive material such as gold, silver, copper, nickel, tungsten, aluminum, and/or alloys thereof.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

As used herein, "plating" or "plated" is used in the present disclosure to describe an operation of forming a film or a layer on a surface. The plating operation includes various steps and processes and varies in accordance with features of embodiments. The film or layer plated on the surface may be a single film or a composite stack. In some embodiments, a plating operation forms a metallic film. In some embodiments, a plating operation includes forming a seed layer and electroplating a metallic film on the seed layer.

As used herein, "filling" or "filled" is used in the present disclosure to describe an operation of forming material in a hole. The filling operation includes various steps and processes and varies in accordance with features of embodiments. In some embodiments, a filling operation includes forming a conductive material in a hole. In some embodiments, a filling operation includes forming a liner on the sidewalls of the hole and forming a conductive film on the liner. In some embodiments, a filling operation includes an electroplating process. In some embodiments, a filling operation includes a vapor deposition process. In some embodiments, a filling operation includes a sputtering process.

The problems and needs outlined above may be addressed by embodiments of the present disclosure. FIG. 1 is a cross sectional view of a portion of a package 10 in a WLP. A contact pad 111 is positioned on a substrate 100. In some embodiments, the contact pad 111 is a part of a top metallization layer on the substrate 100, which may include active structures. The top metallization layer is copper, aluminum, or other suitable materials. A passivation layer 109 covers the upper surface of the substrate 100 and a portion of the upper surface of the contact pad 111. The passivation layer 109 is a dielectric such as an oxide, nitride, or other suitable materials. A polymer layer 107 is positioned on the passivation layer 109. In some embodiments, the polymer layer 107 is a planarization layer with respect to the underlying passivation layer 109. In some embodiments, the materials for the polymer layer 107 can be epoxy, polyimide, polybenzoxazole (PBO), or other suitable materials.

A seed layer 105 is disposed between the polymer layer 107 and a redistribution layer (RDL) 103. In some embodiments, the seed layer 105 is used to promote the adhesion of the RDL 103 to the polymer layer 107. The seed layer 105 and the RDL 103 covers a portion of a top surface of the polymer layer 107 and is partially embedded in the polymer layer 107. As shown in FIG. 1, the seed layer 105 contacts the contact pad 111 through the polymer layer 107. The seed layer 105 and RDL 103 form a conductive plug which connects to the contact pad 111 through the polymer layer 107.

A conductive post 101 is on the RDL 103 and a molding compound 102 is disposed around the conductive post 101. In FIG. 1, a top surface 101A of the conductive post 101 is coplanar with a top surface 102A of the molding compound 102, and hence, when viewing the package 10 from the top, the geometric shape of the top surface 101A of the conductive post 101 is visible.

Figure 2:
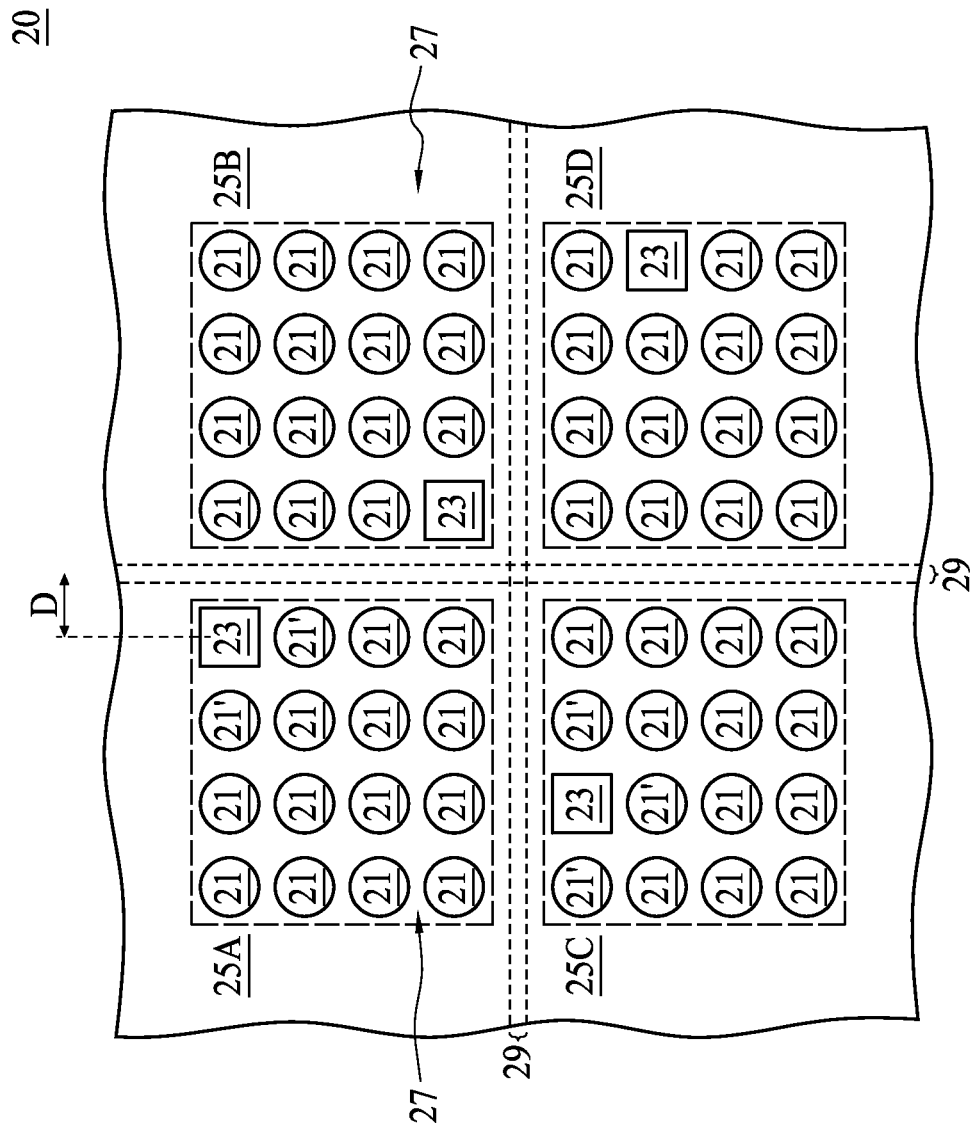
FIG. 2 is a top view of four repeating pattern regions on a portion of a package wafer according to some embodiments of the present disclosure.

FIG. 2 is a top view of a portion of a packaged wafer 20 according to some embodiments of the present disclosure.

The packaged wafer 20 has four repeating pattern regions 25A, 25B, 25C, and 25D. There are several conductive posts in each pattern region (25A to 25D). Pattern region 25A has several first conductive posts or a conductive post array 21 having a first geometric shape and a second conductive post or alignment mark 23 having a second geometric shape. The first geometric shape is distinguishable from the second geometric shape. The first and second conductive posts are positioned in a molding compound 27. An elongated space is between two adjacent pattern regions 25. The elongated space includes a scribe line 29 upon which a singulation machine will be cut through for obtaining singulated packages.

In various embodiments as in FIG. 2, the first conductive posts or conductive post array 21 are the main patterned feature on the packaged wafer 20. In some embodiments, the number of second conductive post 23 is fewer than the number of first conductive posts 21. The singulation machine uses the second conductive post or alignment mark 23 to identify the location of the scribe line 29.

In some embodiments as in FIG. 2, when the singulation machine captures a quadrilateral shape image of the second conductive post 23 in the pattern region 25A, as a packaged wafer 20 advances in one direction on a stage, the arrival of the outer boundaries of pattern region 25A is indicated. The boundaries of a pattern region described in the present disclosure are the dotted lines surrounding each pattern region in FIG. 2 to FIG. 4. Subsequently, the singulation machine generates an auto shift with a distance D from the center of the quadrilateral shape 23 to a center of the scribe line 29.

In FIG. 2, the second conductive post or alignment mark 23 is disposed at various locations in the present disclosure. In some embodiments, a second conductive post or alignment mark is disposed at a corner of a pattern region. For example, a second conductive post or alignment mark 23 is positioned at an upper right corner of the pattern region 25A, or a bottom left corner of the pattern region 25B. In some embodiments, a second conductive post or alignment mark 23 is positioned at an upper left corner or a bottom right corner of a pattern region (not shown). In certain embodiments, the second conductive post or alignment mark 23 of the pattern region 25A is adjacent to two posts 21' of the conductive post array 21. The two posts 21' adjacent to the second conductive post or alignment mark 23 are the nearest neighbors to the second conductive post or alignment mark 23 in the pattern region 25A. In certain embodiments, the second geometric shape possesses at least one edge that is substantially parallel to at least one edge of the pattern region. After singulation, the four pattern regions (25A, 25B, 25C, 25D) on the packaged wafer 20 transform into four singulated packages. For example, the upper horizontal edge of the second geometric shape 23 in the pattern region 25A is parallel to the upper and the lower horizontal outer boundaries (dotted lines) of the pattern region 25A. After singulation, the upper horizontal edge of the second geometric shape 23 in the pattern region 25A is parallel to the upper and the lower edge of the singulated package cut from the packaged wafer 20.

In various embodiments, a second conductive post or alignment mark is disposed on an edge of a pattern region. In FIG. 2, a second conductive post or alignment mark 23 is positioned at an upper edge of the pattern region 25C, or a right edge of the pattern region 25D. In some embodiments, a second conductive post or alignment mark 23 is positioned at a lower edge or a left edge of a pattern region (not shown). In certain embodiments, the second conductive post or alignment mark 23 positioned at the upper edge of the pattern region 25C is adjacent to three posts 21' in the conductive post array 21. The three posts 21' adjacent to the second conductive post or alignment mark 23 are the nearest neighbors to the second conductive post or alignment mark 23 in the pattern region 25C and include two posts 21' on the same edge and one post 21' not on the edge.

Figures 3A, 3B:
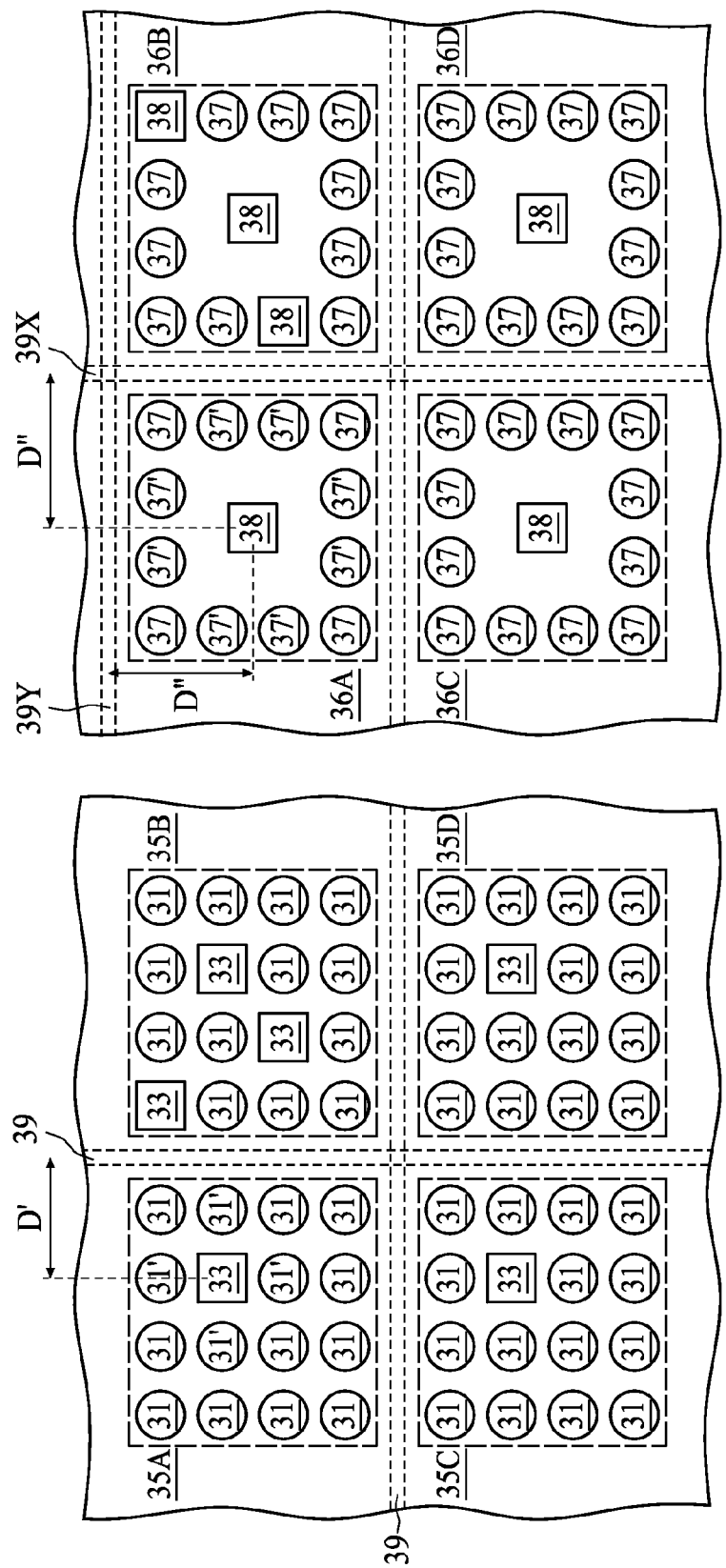
FIG. 3A and FIG. 3B are top views of four repeating pattern regions on a portion of a package wafer according to some embodiments of the present disclosure.

In various embodiments, a second conductive post or alignment mark is disposed in a center portion of each pattern region. The center portion of each pattern region refers to a location that is neither located at the corner, nor located at the edge of the pattern region. In FIG. 3A, a second conductive post or alignment mark 33 is positioned in a center portion of a pattern region 35A. Because the second conductive post or alignment mark 33 is visibly distinguishable from the neighboring first conductive posts or conductive post array 31, the singulation machine registers a cutting location by generating an auto shift with a distance D' from the center of the second conductive post or alignment mark 33 toward the right, to a center of the scribe line 39. In certain embodiments, the second conductive post or alignment mark 33 positioned at a center portion in the pattern region 35A is adjacent to four posts 31' in the conductive post array 31. The four posts 31' adjacent to the second conductive post or alignment mark 33 are the nearest neighbors to the second conductive post or alignment mark 33 in the pattern region 35A.

In various embodiments as in FIG. 3B, a second conductive post or alignment mark 38 is positioned in a center portion of a pattern region 36A. Because the second conductive post or alignment mark 38 is distinguishable from the neighboring first conductive posts or conductive post array 37, the singulation machine registers a cutting location by generating an auto shift with a distance D" from the center of the second conductive post or alignment mark 38 toward the right, to a center of the scribe line 39X in the X-direction. The singulation machine also registers a cutting location by generating an auto shift with a distance D" from the center of the second conductive post or alignment mark 38 upward, to a center of the scribe line 39Y in the Y-direction. In certain embodiments, the second conductive post or alignment mark 38 positioned at a center portion of the pattern region 36A is adjacent to eight posts 37' in the conductive post array 37. The eight posts 37' adjacent to the second conductive post or alignment mark 33' are the nearest neighbors to the second conductive post or alignment mark 33' in the pattern region 36A.

In certain embodiments, each pattern region has more than one second conductive post or alignment mark. For example, in FIG. 3A, the pattern region 35B has one second conductive post or alignment mark 33 at a corner and two at a center portion. For another example, in FIG. 3B, the pattern region 36B has one second conductive post or alignment mark 38 at a corner, one at an edge, and another one at the center portion of the pattern region 36B.

In various embodiments in FIGS. 3A and 3B, the second conductive post or alignment mark further includes a "right angle" feature. In certain embodiments in FIG. 3B, the second conductive post or alignment mark 38 includes at least one "right angle" feature in which one side of the right angle is oriented parallel to the neighboring X-direction scribe line 39X, whereas the other side of the right angle is oriented parallel to the neighboring Y-direction scribe line 39Y. It should be understood that the intersecting scribe lines are not limited to orthogonal arrangement. The present disclosure encompasses any scribe line arrangement deviating from the orthogonal.

In various embodiments, the distinguishable geometric shape includes at least one "L shape" feature (not shown). The "L shape" feature includes an angle that is smaller than 360 degrees and is not necessary a right angle. In certain embodiments, the intersecting scribe line arrangement is not orthogonal. One edge of the "L shape" feature is oriented parallel to the neighboring first direction scribe line, whereas the other edge of the "L shape" feature is oriented parallel to the neighboring second direction scribe line. In certain embodiments, the edges of the "L shape" feature are not all parallel to the neighboring scribe lines.

In some embodiments, in addition to the corner, the edge, and the center portion of the pattern region, the second conductive post or alignment mark can be placed at a periphery of a pattern region. The periphery of a pattern region is the location outside the boundary of a pattern region.

Figure 4:
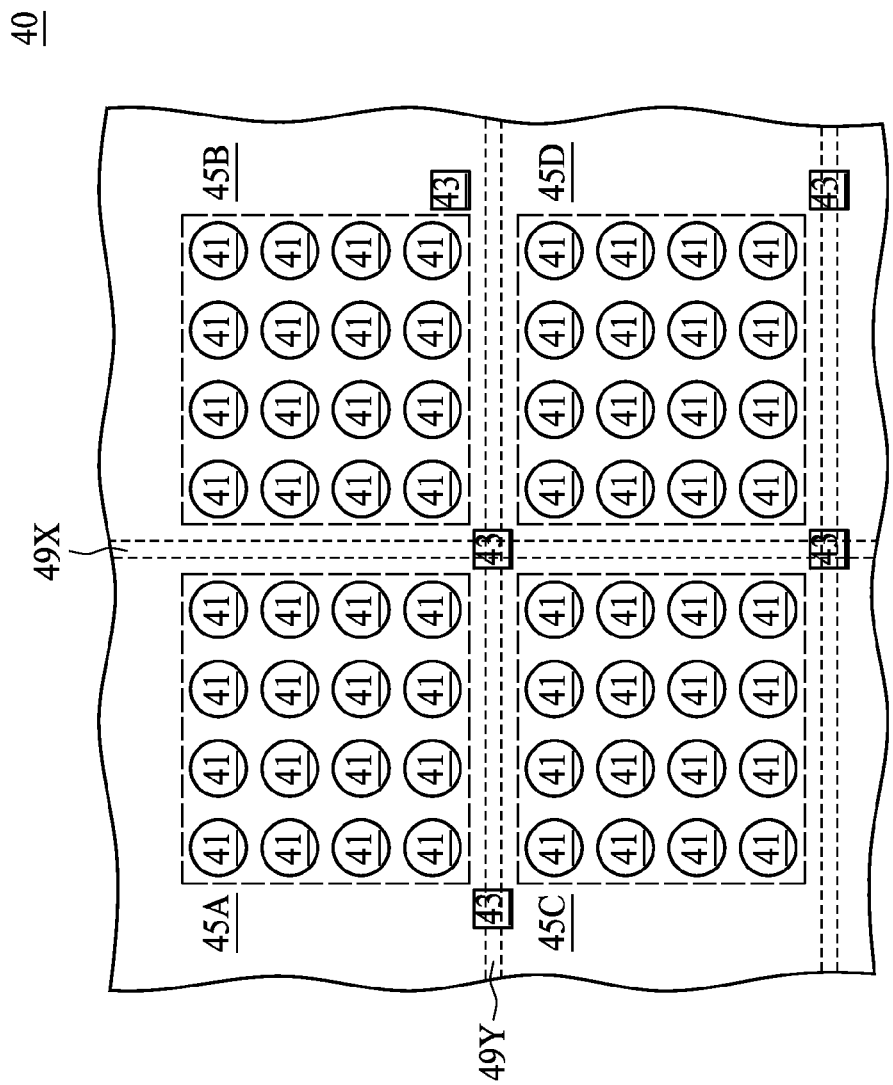
FIG. 4 is a top view of four repeating pattern regions on a portion of a package wafer according to some embodiments of the present disclosure.

In FIG. 4, four pattern regions 45A, 45B, 45C, 45D are arranged on a portion of a package wafer 40, and the boundary of each pattern region is marked by dotted lines. Only first conductive posts or conductive post array 41 are positioned inside the pattern region 45A. Six second conductive posts or alignment marks 43 are placed at the periphery of the pattern regions (45A, 45B, 45C, or 45D). One of the six second conductive posts or alignment marks 43 is positioned at the periphery approximate to the lower right corner of the pattern region 45B. One of the second conductive posts or alignment marks 43 is positioned at the periphery approximate to the left edge of the pattern region 45C. Other positions on the periphery location, for example, the periphery approximate to the left edges of the pattern region 45A, or the periphery approximate to the upper right corner of the pattern region 45B are all encompassed within the scope of the present disclosure. Furthermore, the position of the second conductive post or alignment mark 43 does not have to be situated on the scribe line 49X or 49Y. In certain embodiments, the second conductive post or alignment mark 43 is neither positioned on a single scribe line, nor positioned on the cross section of two scribe lines.

In various embodiments, in FIG. 4, the size of the second conductive post or alignment mark 43 is smaller than that of the first conductive posts or conductive post array 41 in the pattern regions 45A, 45B, 45C, 45D. In certain embodiment, the greatest dimension of the second conductive post or alignment mark 43 is about from 20 to 50 μm, whereas the greatest dimension of the first conductive posts 41 is about from 90 to 120 μm. In other embodiments (not shown in figures), the largest dimension of the second conductive post or alignment mark is substantially equal to that of the first conductive posts in the pattern regions.

Figure 5A:
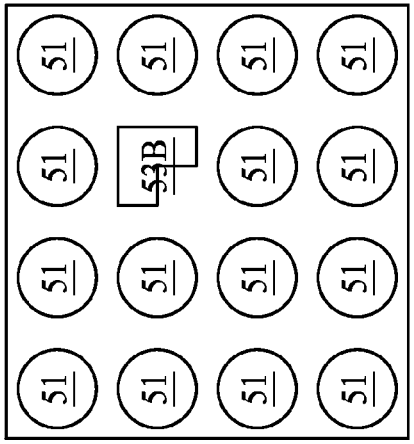
FIG. 5A to FIG. 5D are top views of singulated packages which include some first conductive posts or a conductive post array and one second conductive post or alignment mark according to some embodiments of the present disclosure.

In various embodiments, the first conductive post includes a conical shape, and the second conductive post or alignment mark includes a geometric shape distinguishable from the conical shape. FIG. 5A is a top view of a singulated package 55A which includes some first conductive posts or a conductive post array 51 having a conical shape, and a second conductive post or alignment mark 53A having a polygonal shape. In FIG. 5A, the second conductive post or alignment mark 53A is a cross, and the second conductive post or alignment mark 53A is positioned at an upper right corner of the singulated package 55A. There are more than one right angle on the second conductive post or alignment mark 53A, for example, every two adjacent sides manifest a right angle. The right angle feature is utilized in a scribe line alignment process. However, the second conductive post or alignment mark 53A is not limited to a specific package wafer with orthogonal scribe lines. In some embodiments, the second conductive post or alignment mark 53A is used in a package wafer with scribe lines of two directions traversing with a 60 degrees angle.

Figure 5B:
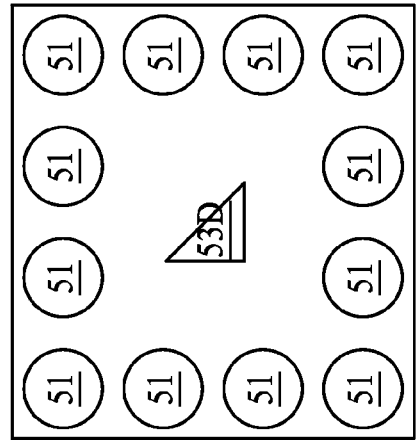

FIG. 5B is a top view of a singulated package 55B which includes a plurality of first conductive post 51 having a conical shape, and a second conductive post or alignment mark 53B having a polygonal shape. The second conductive post or alignment mark 53B has a right angle "L" feature, and the second conductive post or alignment mark 53B is positioned at a center portion of the singulated package 55B. There is more than one right angle on the second conductive post or alignment mark 53B, for example, every two adjacent sides manifest a right angle. The right angle feature is utilized in a scribe line alignment process. However, the second conductive post or alignment mark 53B is not limited to specific package wafer with orthogonal scribe lines. In some embodiments, the second conductive post or alignment mark 53B is used in a package wafer with scribe lines of two directions traversing with a 30 degrees angle.

Figure 5C:
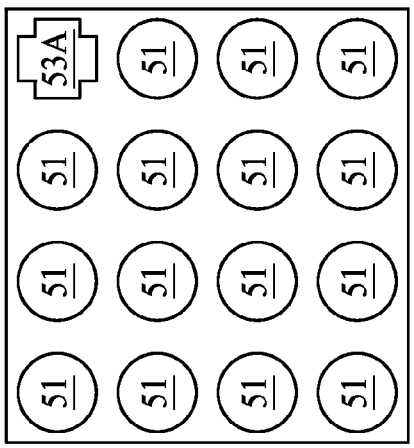

FIG. 5C is a top view of a singulated package 55C which includes a conductive post array 51. The geometric shape of each first conductive post in the conductive post array 51 is a conical shape, and a second conductive post or alignment mark 53C has a polygonal shape. The second conductive post or alignment mark 53C has more than one conductive feature, and the second conductive post or alignment mark 53C is positioned at a left edge of the singulated package 55C. The second conductive post or alignment mark 53C has more than one conductive feature in a sense that it essentially composes two quadrilateral shapes partially connected to each other. In certain embodiments, the two quadrilateral shapes are made of conductive materials, and hence two conductive features are included in a second conductive post or alignment mark 53C.

In certain embodiments, when the two quadrilateral shapes are two rectangles or two squares, there are several right angles on the second conductive post or alignment mark 53C, for example, every two adjacent sides manifest a right angle. The right angle is utilized in a scribe line alignment process. However, the second conductive post or alignment mark 53C is not limited to a specific package wafer with orthogonal scribe lines. In some embodiments, the second conductive post or alignment mark 53C is used in a package wafer with scribe lines of two directions traversing with a 15 degrees angle.

Figure 5D:
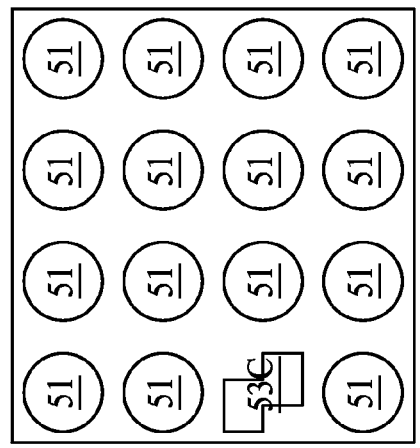

FIG. 5D is a top view of a singulated package 55D which includes a conductive post array 51 having a conical shape. The geometric shape of each first conductive post constituting the conductive post array 51 is a conical shape, and a second conductive post or alignment mark 53D has a polygonal shape. The second conductive post or alignment mark 53D is positioned at a center portion of the singulated package 55D and has a triangular feature. In certain embodiments, when the second conductive post or alignment mark 53D is a right triangle, there is at least one right angle on the second conductive post or alignment mark 53D. The right angle is utilized in a scribe line alignment process. However, the second conductive post or alignment mark 53D is not limited to specific package wafer with orthogonal scribe lines. In some embodiments, the second conductive post or alignment mark 53D is used in a package wafer with scribe lines of two directions traversing with a 75 degrees angle.

From a top view perspective, the first conductive post or the conductive post array 51 shown in FIG. 5A to FIG. 5D have a conical shape in some embodiments. However, in other embodiments, the first conductive post or conductive post array 51 are not limited to a conical shape. Any other shapes are applicable as long as the shape of the first conductive post or conductive post array is distinguishable from the second conductive post or alignment mark.

In various embodiments, the first conductive post or conductive post array includes a conical shape, and the second conductive post or alignment mark includes a geometric shape distinguishable from the conical shape. FIG. 6A is a top view of a singulated package 65A which includes some first conductive posts 61 having a conical shape, and two second conductive posts or alignment marks 63A and 64A. The alignment mark 63A is positioned at a lower right corner of the singulated package 65A and the alignment mark 63A is a ring shape. In some embodiments, the alignment mark 63A is a quadrilateral ring. In certain embodiments, the alignment mark 63A has a rectangular outer ring and a square inner ring. In certain embodiments, the alignment mark 63A has a rectangular outer ring and a conical inner ring. In certain embodiments, the alignment mark 63A has a square outer ring and an identical but smaller square inner ring.

In some embodiments, more than one second conductive post or alignment marks are positioned on a singulated package. In certain embodiments, the second conductive posts have an identical geometric shape. However, in some embodiments, the second conductive posts have different geometric shapes. In FIG. 6A, the pattern region 67A has another second conductive post or alignment mark 64A located at a periphery approximate to the upper left corner of the pattern region 67A. The second conductive post or alignment mark 64A has a polygonal shape. In FIG. 6A, the second conductive post or alignment mark 64A is a cross. In certain embodiments, the alignment mark 64A includes some right angles. In certain embodiments, the cross feature of the alignment mark includes a traversing angle of 60 degrees or 75 degrees. In some embodiments, the size of the second conductive post or alignment mark 64A is smaller than that of the first conductive post 61 located inside of the pattern region 67A. In certain embodiments, the largest dimension, for example the diagonal length, of the second conductive post or alignment mark 64A is about 30 μm. The largest dimension, for example the diameter, of the first conductive post 61 is about 100 μm.

FIG. 6B is a top view of a singulated package 65B which includes more than one first conductive post 61, and a second conductive post or alignment mark 63B. The first conductive post has a conical shape. The alignment mark 63B is positioned at a center portion of the singulated package 65B, and the alignment mark 63B includes more than one conductive feature, namely 631, 633, and 635. In FIG. 6B, the conductive features (631, 633, 635) all have an "L" shape topography, and each conductive feature (631, 633, or 635) are oriented in different directions. In FIG. 6B, the right angle of the "L" shape topography in conducive feature 631 is pointing to the lower left corner of the singulated package 65B. The right angle of the "L" shape topography in conducive feature 633 is pointing to the upper left corner of the singulated package 65B. The right angle of the "L" shape topography in conductive feature 635 is pointing to the lower right corner of the singulated package 65B.

In some embodiments, the alignment mark 63B shown in FIG. 6B includes an additional conductive feature (not shown) with the right angle thereof pointing to the upper right corner of the singulated package 65B. In this case, if each conductive feature shares an identical shape, the alignment mark 63B is considered four-fold symmetric with respect to the center of the alignment mark 63B. However, the arrangement of the conductive features does not have to be symmetric. In some embodiments, the conductive features are an assembly of identical topographies having a same orientation.

FIG. 6C is a top view of a singulated package 65C which includes a conductive post array 61 and two conductive posts or alignment marks 63C and 64C. The geometric shape of each conductive post of the conductive post array 61 has a conical shape. The alignment marks 63C and 64C are respectively positioned at two diagonal corners of the singulated package 65C. The alignment marks 63C and 64C both include at least one curve and one angle. In some embodiments as in FIG. 6C, the alignment mark 63C possesses a curve 637 and an angle 639. The curve 637 is the circumference of a three-fourth circle, and the angel 639 is 270 degrees. The complementary angle to the angle 639 formulates a right angle. However, neither the curve of the alignment mark is limited to a portion of the circumference of a circle, nor the angle of the alignment mark is limited to 270 degrees. For example, the alignment mark 64C of FIG. 6C demonstrates a curve 641 to be a portion of the perimeter of an ellipse, and the angle 643 is 330 degrees. In this case, the complementary angle to the angle 643 is 30 degrees.

In some embodiments, the second conductive post or alignment mark includes more than one conductive post on a singulated package. In certain embodiments, the second conductive posts have an identical shape. However, in some embodiments, the second conductive posts include at least two different geometric shapes. FIG. 6D is a top view of a singulated package 65D which includes a conductive post array 61 and three conductive posts or alignment marks 63D, 64D, and 66D. The geometric shape of the conductive posts in the conductive post array 61 includes a conical shape. Each of the alignment marks (63D, 64D, 66D) has different geometric shapes. The alignment marks 63D and 64D are located inside the pattern region 67D, whereas the alignment mark 66D is located at the periphery of the pattern region 67D. The alignment mark 63D is positioned at the upper right corner of the pattern region 67D, and the alignment mark 63D has a triangular shape with a right angle. The alignment mark 66D at the periphery approximate to the upper right corner of the pattern region 67D has an "L" shape topography with a right angle pointing to the upper right corner of the singulated package 65D.

In FIG. 6D, the alignment mark 64D located at the lower edge of the pattern region 67D includes two curves (645, 647) and an angle 649. The alignment mark 64D is a heart shape having two curves (645, 647) and an angle 649 connecting to the two curves (645, 647). In some embodiments, the two curves do not have to be two identical segments, that is, one curve has a different curvature from the other curve. The angle 649 in the alignment mark 64D has an angle less than 360 degrees. In certain embodiments, the lower prong of the angle 649 (the prong connected to the curve 645) is substantially parallel to the upper and the lower horizontal edges of the singulated package 65D. In said embodiments, only a portion of the alignment mark 64D is parallel to the any of the edges of the singulated package 65D.

From a top view perspective, the geometric shape of the first conductive post or conductive post array 61 in FIG. 6A to FIG. 6D is a conical shape in some embodiments. However, in other embodiments, the first conductive post or conductive post array 61 are not limited to a conical shape. Any other shapes are applicable as long as the geometric shape of the first conductive post or conductive post array is distinguishable from that of the second conductive post or alignment mark.

In various embodiments, the second conductive post or alignment mark is positioned at a non-active area of a package wafer. FIG. 7A is a top view of a singulated package having some first conductive posts 71 and a second conductive post or alignment mark 73 situated at the upper right corner of the singulated package. In some embodiments, the second conductive post or alignment mark 73 is placed at an active area in FIG. 7B. In some embodiments, the second conductive post or alignment mark 73 is placed at a non-active area in FIG.

7C. In FIG. 7C the second conductive post or alignment mark 73 is not connected to an RDL and a contact pad.

Figure 7B:
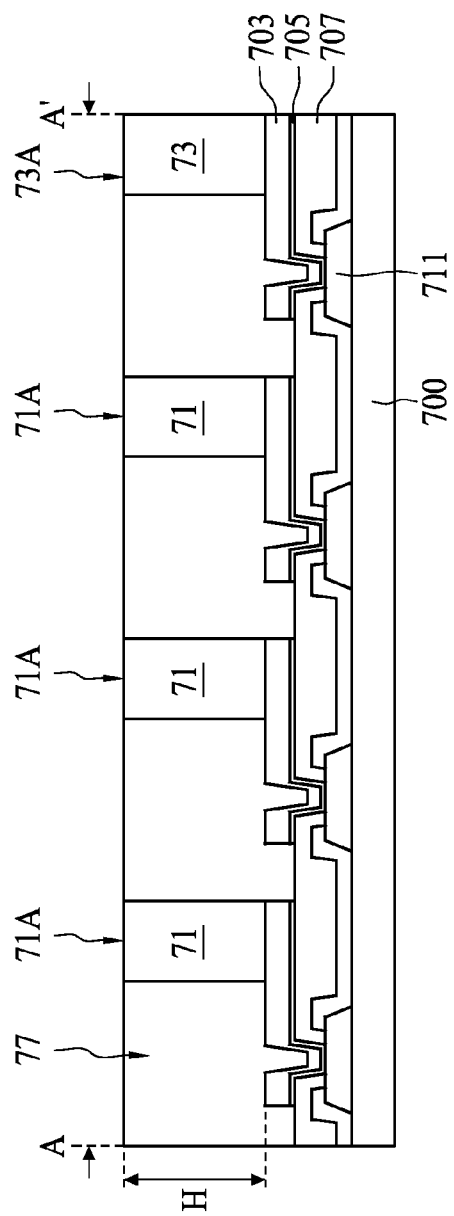
FIG. 7B and FIG. 7C are the cross sectional views along line AA' in FIG. 7A according to embodiments of the present disclosure.
Figure 7C:
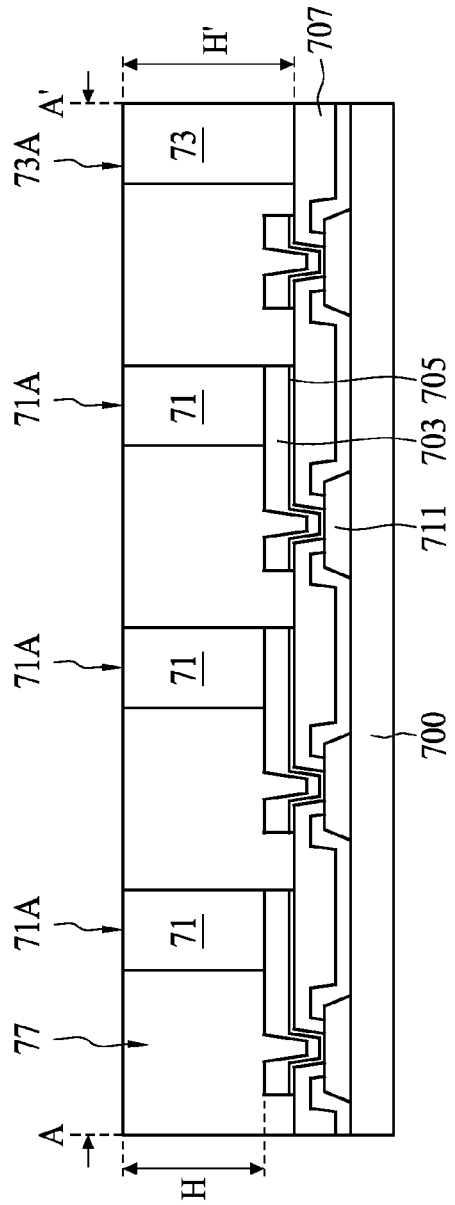
Figure 7A:
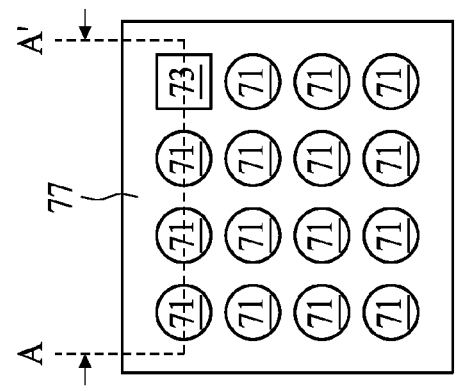
FIG. 7A is a top view of a singulated package having some first conductive posts or a conductive post array and a second conductive post or alignment mark according to some embodiments of the present disclosure.

FIG. 7B is a cross sectional view along line AA' in FIG. 7A. From a top view perspective, the left end of line AA' is positioned on the molding compound 77, and the right end of line AA' is located at the right edge of the second conductive post or alignment mark 73. In FIG. 7B, three first conductive posts 71 are positioned on the RDL 703, from which the electrical conductive path passes through the seed layer 705 below the RDL 703, the contact pad 711 on the semiconductor substrate 700, and leads to the active structures (not shown) in the semiconductor substrate 700. In some embodiments, the three first conductive posts 71 are positioned at an active area of the singulated package.

In FIG. 7B, the second conductive post or alignment mark 73 is also positioned at an active area of the singulated package. In certain embodiments, the alignment mark 73 situates directly on the contact pad 711 without an RDL 703 and/or a seed layer 705 in between. In certain embodiments, the alignment mark 73 situates on the seed layer 705. As long as the alignment mark 73 is electrically connected with the active structure in the semiconductor substrate 700, the alignment mark 73 is considered to be located at an active area. The alignment mark 73 acts as an electrical interconnect communicating between the active structure in the semiconductor substrate 700 and other components in the singulated package.

FIG. 7C is another cross sectional view along line AA' in FIG. 7A. From a top view perspective, the left end of line AA' is positioned on the molding compound 77, and the right end of line AA' is located at the right edge of the second conductive post or alignment mark 73. In FIG. 7C, three first conductive posts 71 are positioned on the RDL 703, from which the electrical conductive path passes through the seed layer 705 below the RDL 703, the contact pad 711 on the semiconductor substrate 700, and leads to the active structures (not shown) in the semiconductor substrate 700. In some embodiments, the three first conductive posts 71 are positioned at an active area of the singulated package.

In FIG. 7C, the second conductive post or alignment mark 73 is positioned directly on the dielectric layer 707 and thus is not electrically connected to the active structure in the substrate 700. The second conductive post or alignment mark 73 in FIG. 7C is located at a non-active area of the singulated package. In certain embodiments, the second conductive post or alignment mark 73 situated at a non-active area is called a dummy post or a floating post. The second conductive post or alignment mark 73 in FIG. 7C is disposed adjacent to one first conductive post 71.

In FIG. 7B and FIG. 7C, a top surface 73A of the second conductive post or alignment mark 73 and a top surface 71A of the first conductive post or conductive post array 71 are coplanar. In FIG. 7B, both the second conductive post or alignment mark 73 and the first conductive post or conductive post array 71 have a same height H viewing from the cross section of the singulated package. However, in certain embodiments, the height of the first conductive post or conductive post array and the second conductive post or alignment mark are different. For example, in FIG. 7C, the second conductive post or alignment mark 73 has a height H', and the first conductive post or conductive post array 71 has a height H. Even if the top surface 73A of the second conductive post or alignment mark 73 and that of the first conductive post or conductive post array 71 are coplanar, the height H' is greater than the height H.

Figures 8A, 8B:
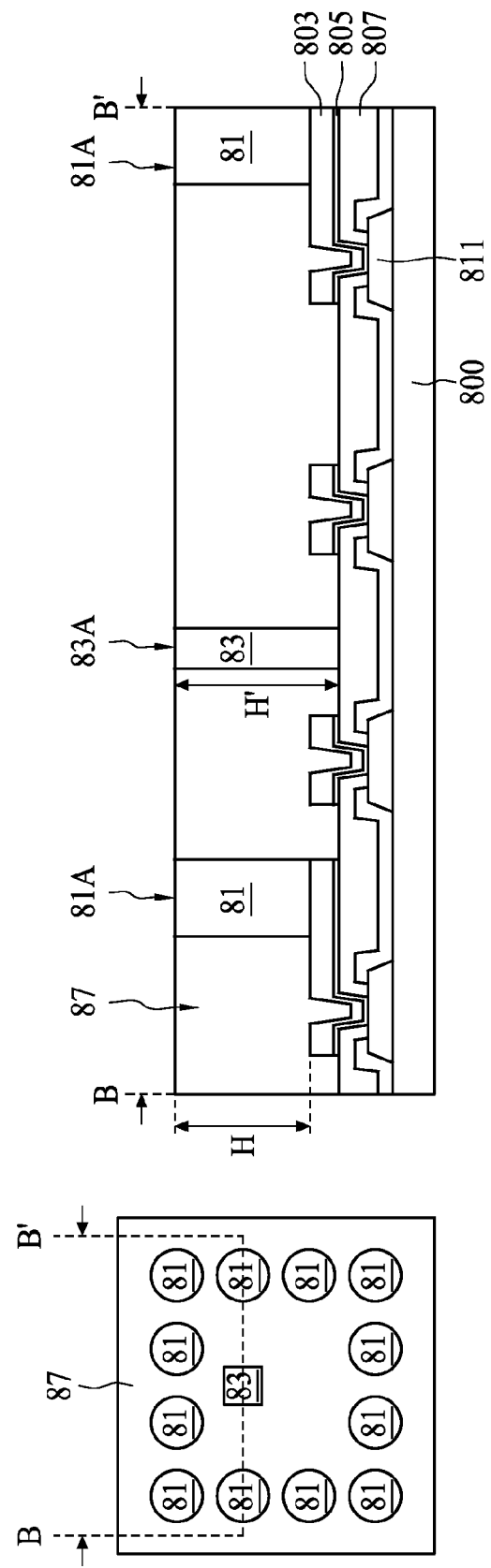
FIG. 8A is a top view of a singulated package having some first conductive posts or a conductive post array and a second conductive post or alignment mark according to some embodiments of the present disclosure.
FIG. 8B is the cross sectional view along line BB' in FIG. 8A according to some embodiments of the present disclosure.

In various embodiments, the dummy post is placed at a center portion of the singulated package. FIG. 8A is a top view of a singulated package having some first conductive posts or a conductive post array 81 and a second conductive post or alignment mark 83 located at a center portion of the singulated package. In some embodiments, the second conductive post or alignment mark 83 is placed at a non-active area of the singulated package. FIG. 8B is the cross sectional view along line BB' in FIG. 8A. From a top view perspective, the left end of line BB' is positioned on the molding compound 87, the middle point of line BB' passes through the alignment mark 83, and the right end of line BB' is located at the right edge of the first conductive post 81. In FIG. 8B, two first conductive posts 81 are positioned on the RDL 803, from which the electrical conductive path passes through the seed layer 805 below the RDL 803, the contact pad 811 on the semiconductor substrate 800, and leads to the active structures (not shown) in the semiconductor substrate 800. In some embodiments, the two first conductive posts 81 are positioned at an active area of the singulated package.

In FIG. 8B, the second conductive post or alignment mark 83 is positioned directly on the dielectric layer 807 and thus is not electrically connected to the active structure in the substrate 800. The second conductive post or alignment mark 83 in FIG. 8B is located at a non-active area of the singulated package, and in certain embodiments, the second conductive post or alignment mark 83 situated at a non-active area is called a dummy post or a floating post.

In certain embodiments, the dimension of the dummy post or the floating post located at a center portion of the package is smaller than the dimension of the first conductive post located on the same package. For example, as show in FIG. 8A, the diagonal length of the alignment mark 83 is about 20 μm, whereas the diameter of the first conductive post 81 is about 90 μm. In certain embodiments, the dimension of the dummy post located at a center portion of the package is identical to the dimension of the first conductive post located on the same package. For example, the diagonal length of the alignment mark and the diameter of the first conductive post 81 are both around 100 μm.

In FIG. 8B, the top surface 83A of the second conductive post or alignment mark 83 and the top surface 81A of the first conductive post or conductive post array 81 are coplanar. In FIG. 8B, the second conductive post or alignment mark 83 has a height H', and the first conductive post or conductive post array 81 has a height H. Even if the top surface 83A of the second conductive post or alignment mark 83 and that of the first conductive post or conductive post array 81 are coplanar, the height H' is greater than the height H.

In various embodiments, the dummy post or the floating post is placed at the periphery of a singulated package. FIG. 9A is a top view of a singulated package having some first conductive posts or a conductive post array 91 and a second conductive post or alignment mark 93 at the periphery approximate to the upper right and the lower left corner of the singulated package. In some embodiments, the second conductive post or alignment mark 93 is placed at a non-active area in FIG. 9B. FIG. 9B is the cross sectional view along line CC' in FIG. 9A. From a top view perspective, the left end of line CC' is positioned on the molding compound 97, and the right end of line CC' is located at the edge of the first conductive post 91. In FIG. 9B, two first conductive posts 91 are positioned on the RDL 903, from which the electrical conductive path passes through the seed layer 905 below the RDL 903, the contact pad 911 on the semiconductor substrate 900, and leads to the active structures (not shown) in the semiconductor substrate 900. In some embodiments, the two first conductive posts 91 are positioned at an active area of the singulated package.

In FIG. 9B, the second conductive post or alignment mark 93 is positioned directly on the dielectric layer 907 and thus is not electrically connected to the active structure in the substrate 900. The second conductive post or alignment mark 93 in FIG. 9B is located at a non-active area of the singulated package, and in certain embodiments, the second conductive post or alignment mark 93 situated at a non-active area is called a dummy post or a floating post.

In certain embodiments, the dimension of the dummy post located at the periphery of the package is smaller than the dimension of the first conductive post located on the same package. For example, as show in FIG. 9A, the diagonal length of the alignment mark 93 is about 50 μm, whereas the diameter of the first conductive post 91 is about 120 μm.

In FIG. 9B, the top surface 93A of the second conductive post or alignment mark 93 and the top surface 91A of the first conductive post or conductive post array 91 are coplanar. In FIG. 9B, the second conductive post or alignment mark 93 has a height H', and the first conductive post or conductive post array 91 has a height H. Even if the top surface 93A of the second conductive post or alignment mark 93 and that of the first conductive post or conductive post array 91 are coplanar, the height H' is greater than the height H.

Figure 10:
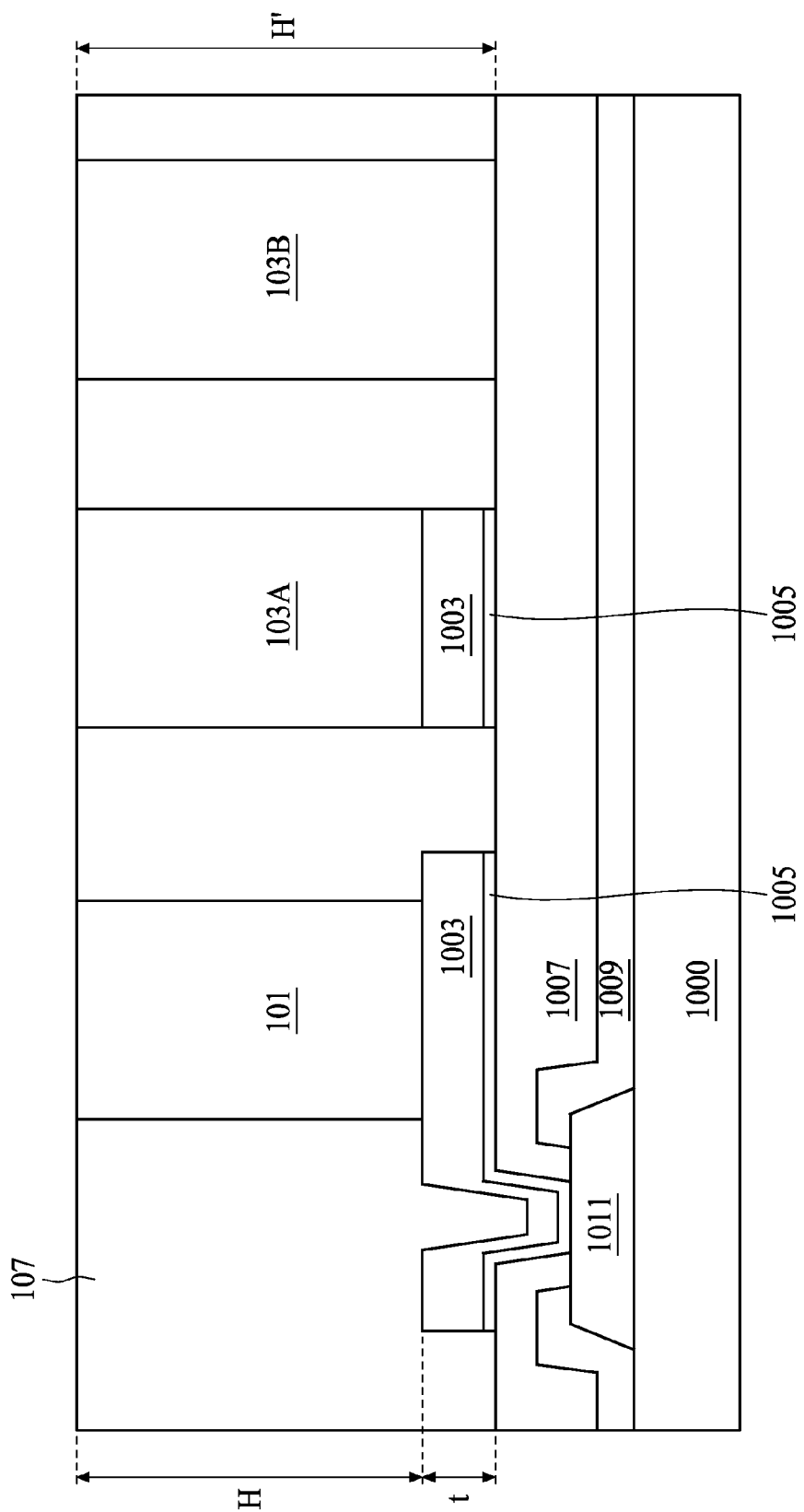
FIG. 10 is the cross sectional view of a singulated package according to some embodiments of the present disclosure.

In various embodiments, a first conductive post located at an active area and a second conductive post located at a non-conductive area have a same height from a cross sectional point of view. In FIG. 10, the first conductive post 101 is positioned on an RDL 1003, from which the electrical conductive path passes through the seed layer 1005 below the RDL 1003, the contact pad 1011 on the semiconductor substrate 1000, and leads to the active structures (not shown) in the semiconductor substrate 1000. In certain embodiments, the alignment mark 103A is located at a non-active area. Alignment mark 103A situated on an RDL 1003 which does not have an electrical communication path connecting to the active structure in the semiconductor substrate 1000, and hence the alignment mark 103A is a dummy post or a floating post. However, in other embodiments, the alignment mark 103A is located at an active area. Alignment mark 103A situated on an RDL 1003 which has an electrical communication path connecting to the active structure in the semiconductor substrate 1000, and hence the alignment mark 103A is a functional post Alignment mark 103B situated on the dielectric layer 1007 does not have an electrical communication with the active structure in the semiconductor substrate 1000, and hence the alignment mark 103B is a dummy post.

In FIG. 10, the first conductive post 101 and the alignment mark 103A has a same height H, whereas the alignment mark 103B has a different height H'. The RDL 1003 and the seed layer 1005 under the alignment mark 103A have a total thickness t identical to those under the first conductive post 101, and hence the height of the first conductive post 101 and that of the alignment mark 103A are the same. The alignment mark 103B is not positioned on an RDL, in this case, the height H' of the alignment mark 103B is different from the height H of the first conductive post 101 and the height H of the alignment mark 103A.

Figure 11:
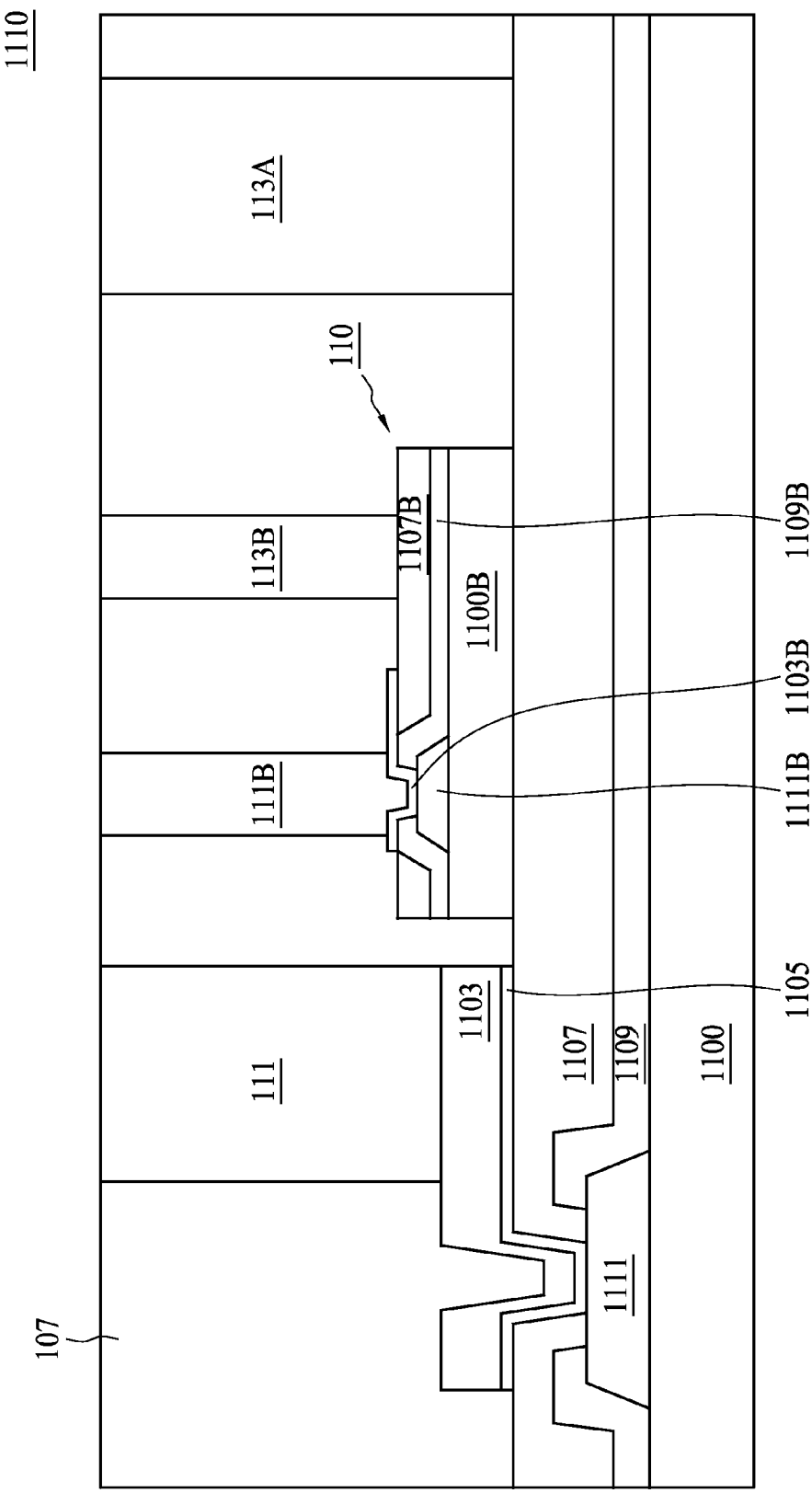
FIG. 11 is the cross sectional view of a singulated package according to some embodiments of the present disclosure.

In various embodiments, the active area refers not only to the active structure in a package wafer, but also to the active structure in a semiconductor chip placed on the package wafer. FIG. 11 is a cross sectional view of a singulated package 1110 with a semiconductor chip 110 disposed in the singulated package 1110. The semiconductor chip 110 is constructed in a face-to-back fashion on the package 1110, in which the back surface of the die 1100B is positioned on the dielectric layer 1107 of the singulated package 1110. The contact pad 1111B is positioned on the top surface of the die 1100B and electrically connected to the RDL 1103B. Two conductive posts are positioned on the semiconductor chip 110. Conductive post 111B is positioned at an active area of the semiconductor chip 110, whereas the conductive post 113B is positioned at a non-active area of the semiconductor chi p 110.

Still referring to FIG. 11, the singulated package 1110 includes a substrate 1100, a contact pad 1111 positioned on the substrate 1100, a passivation layer 1109 covering the top surface of the substrate 1100 and a portion of the contact pad 1111. A dielectric layer 1107 is on the passivation layer 1109 for planarization. A seed layer 1105 is located between the underlying dielectric layer 1107 and an RDL 1103 for adhesion promotion. Two conductive posts are positioned on the singulated package 1110. In certain embodiments, conductive post 111 is positioned at an active area of the package 1110, whereas the conductive post 113A is positioned at a non-active area of the package 1110.

Still referring to FIG. 11, in some embodiments, the conductive posts 113A and 113B are second conductive post or alignment mark with geometric shapes distinguishable from the geometric shape of the two first conductive posts 111 and 111B. In this connection, the second conductive post or alignment mark 113A and 113B are dummy posts because they are located at a non-active area of the singulated package 1110 and the semiconductor chip 110B, respectively. In certain embodiments, the conductive post 113A is located at a right edge of the singulated package 1110, and the conductive post 113B is placed at a center portion of the singulated package 1110.

Still referring to FIG. 11, in some embodiments, the conductive posts 111B and 113A are second conductive post or alignment mark with geometric shapes distinguishable from the geometric shape of the two first conductive posts or conductive post array 111 and 113B. In this connection, the alignment mark 113A is a dummy post but the alignment mark 111B is a functional post. In other words, the alignment mark 111B is electrically connected to the active structure in the semiconductor chip 110. In certain embodiments, the conductive post 113A is located at a right edge of the singulated package 1110, and the conductive post 111B is placed at a center portion of the singulated package 1110. It should be understood that the alignment marks 111B and 113A, though different in height and width, possess geometric shapes distinguishable from that of the other two first conductive posts 111 and 113B from a top view perspective.

In some embodiments, the singulated package 1110 has two conductive posts 111 and 111B. Because the two conductive posts 111 and 111B are both placed at the active area, conductive post 111 is electrically communicating with the active structure in the substrate 1100 of the singulated package 1110, while conductive post 111B is electrically coupled to the active structure in the die 1100B of the semiconductor chip 110. In the absence of any dummy post, the conductive posts 111 and 111B act as alignment marks and possess geometric shapes distinguishable from that of the other conductive posts (not shown) in the singulated package 1110. In certain embodiments, the alignment marks are all be positioned on active areas, performing the function of both electrical communication and the location indication for a singulation operation.

The present disclosure provides a method of manufacturing a semiconductor structure including a molding compound, first conductive posts or conductive post array, and a second conductive post or alignment mark. The first conductive posts or conductive post array has a first geometric shape distinguishable from the second geometric shape of the second conductive post or alignment mark. FIG. 12A to FIG. 12F are the manufacturing operations used to obtain the semiconductor structure described in some embodiments of the present disclosure.

Figure 12A:
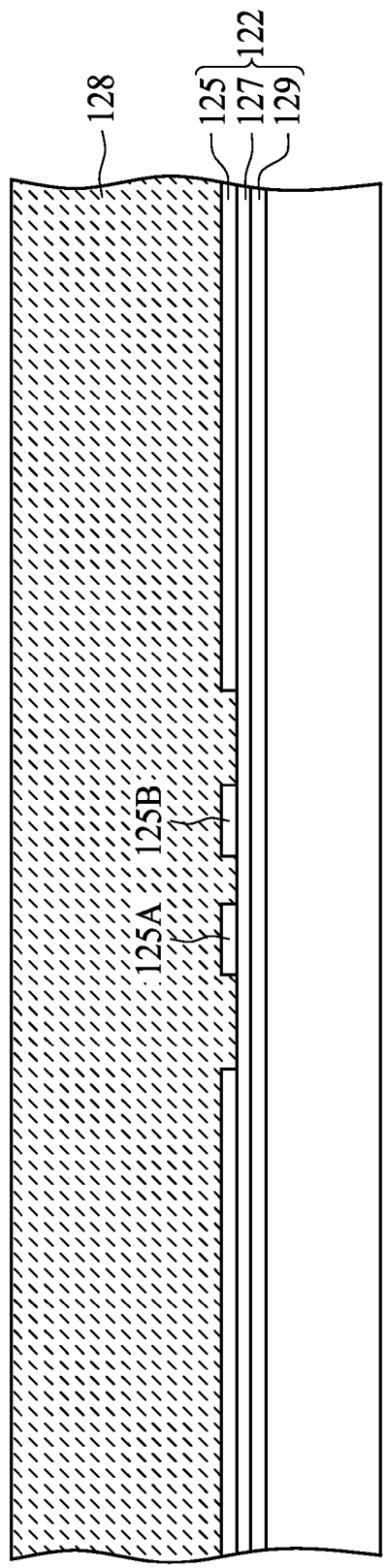
FIG. 12A to FIG. 12F are some of the manufacturing operations used to obtain the semiconductor structure according to some embodiments of the present disclosure.

FIG. 12A is a portion of a semiconductor package wafer which includes a substrate 120, a passivation layer 129 is a thin film subsequently deposited on the substrate 120. In certain embodiments, the passivation layer 129 is formed with dielectric materials, such as spin-on glass (SOG), silicon oxide, silicon oxynitride, silicon nitride or other suitable materials. A dielectric layer 127 is then deposited on the passivation layer 129 in order to planarize the top surface of the semiconductor structure. In certain embodiments, the dielectric layer 127 is formed by depositing polymer materials such as epoxy, polyimide, polybenzoxazole (PBO), and other suitable materials. A seed layer 125 is then formed on top of the dielectric layer 127. In certain embodiments, the seed layer 125 is disposed by a physical or chemical deposition. In certain embodiments, the seed layer 125 is a single layer or a composite stack of conductive materials such as copper, titanium, or other suitable materials.

In some embodiments, the middle portion of the seed layer 125 is removed by a patterned etching operation, leaving two seed layer islands 125A, 125B on the dielectric layer 127. However, in other embodiments, the middle portion of the seed layer 125 is removed by a patterned etching operation without remaining seed layer islands (not shown). A photoresist layer 128 is then disposed on top of the patterned seed layer 125 by a spin coating operation. During the spin coating operation, the photoresist penetrates into and fills up the spaces created by the removal of a portion of the seed layer 125. A negative photoresist is used with the appropriate corresponding spinning rate in the present disclosure. In certain embodiments, the passivation layer 129, the dielectric layer 127, the patterned seed layer 125, together with the semiconductor substrate 120 is a carrier 122 prepared for the subsequent conductive post formation.

Figure 12B:
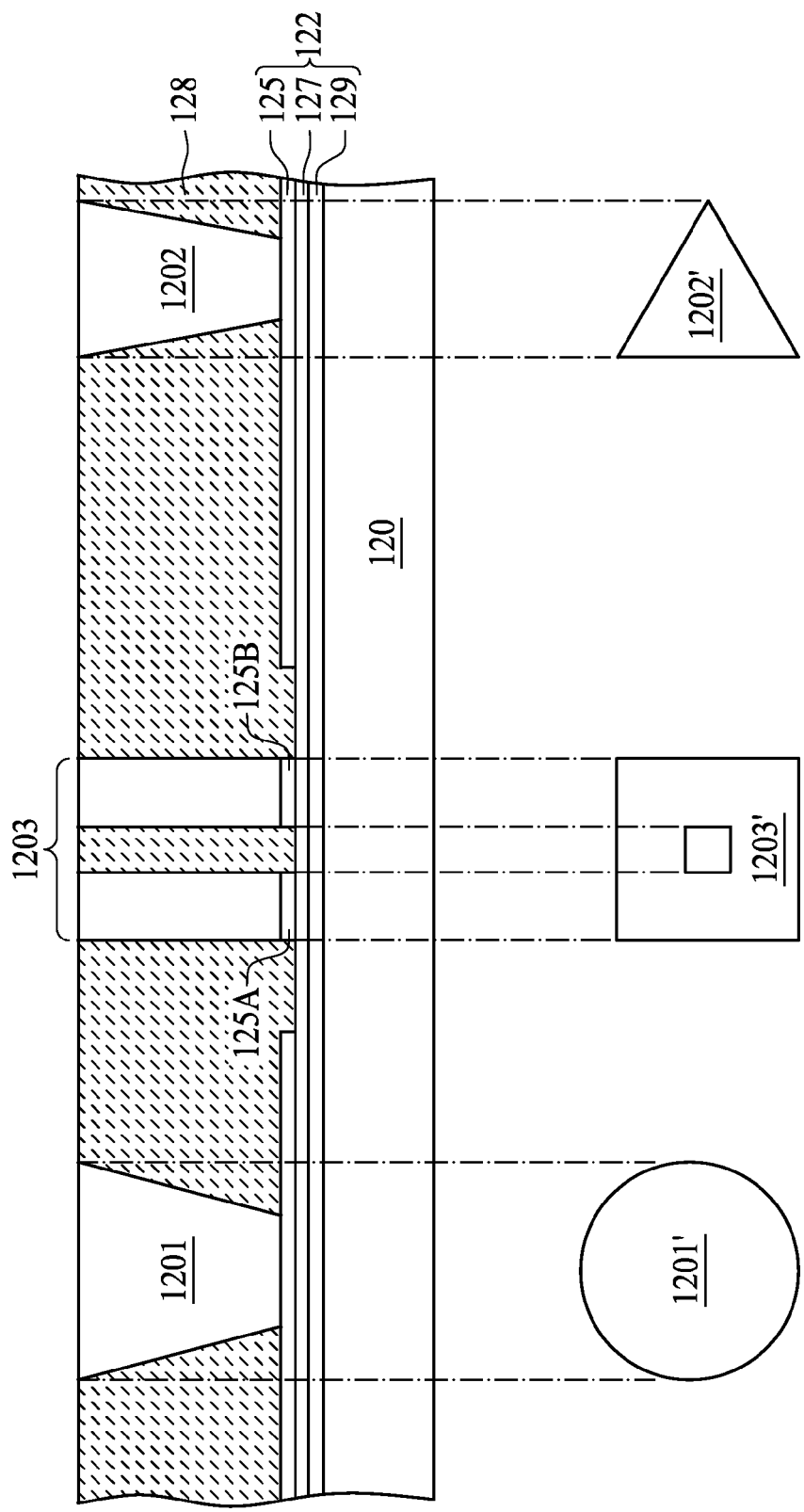

In FIG. 12B, three through holes are formed in the photoresist layer 128 of a portion of the package wafer. Perceived from the top of the package wafer, the geometric shapes of the three through holes are also demonstrated in FIG. 12B. From a top view perspective, through hole 1201 possesses a conical shape 1201'; through hole 1203 has a quadrilateral outer ring and a quadrilateral inner ring; through hole 1202 has a triangular feature 1202'. In certain embodiments, at least one through hole possesses a conical shape, and at least one through hole has a non-conical shape, or any other shape that is distinguishable from the conical shape. In certain embodiments, through holes 1201, 1202, 1203 are formed by a lithography operation utilizing a hard mask having predetermined patterns.

In other embodiments where the carrier 122 has no seed layer islands 125A, 125B, the through hole 1203 shown in FIG. 12B has one end exposed to the air and the other end exposed to the dielectric layer 127.

In certain embodiments, through holes 1201, 1202 have tapered side walls whereas through hole 1203 has a straight sidewall. For demonstration purpose only, the extent of tapering of the tapered side walls is not drawn to scale. The cause of the tapered side walls is, for example, the light source dosage is not evenly distributed across the thickness of the photoresist 128.

Figure 12C:
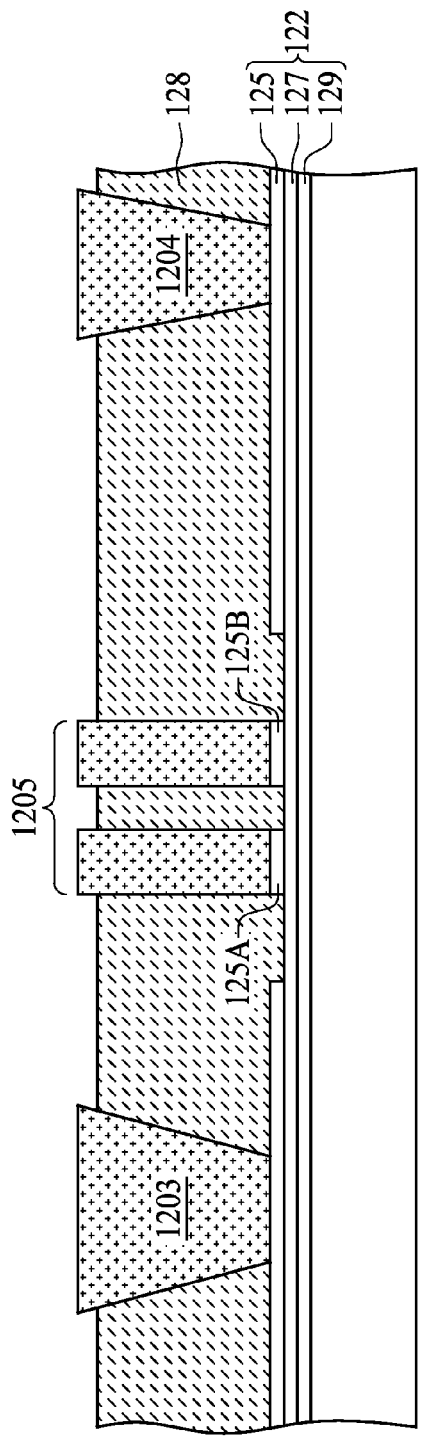

In FIG. 12C, the three through holes shown in FIG. 12B is filled with conductive materials to form three conductive posts. In some embodiments, the conductive posts are composed of gold, silver, copper, nickel, tungsten, aluminum, titanium, manganese, other suitable conductive materials, or the alloys thereof. Viewing from the top of the package wafer, conductive post 1203 has a conical shape, whereas conductive posts 1204 and 1205 have non-conical shapes. Referring to FIG. 12B and FIG. 12C, because the seed layer islands 125A, 125B are present at the bottom of the through hole 1205, the filling of the conductive materials utilizes a plating operation. In the present disclosure, the plating procedure includes both electroplating and electroless plating. However, in other embodiments, when no seed layer islands 125A, 125B are present at the bottom of the through hole 1203, the filling operation is carried out by chemical or physical vapor deposition such as sputtering. Referring to FIG. 12C, in certain embodiments, the through holes are overfilled with the conductive materials because the top surfaces of the conductive posts 1203, 1204, 1205 are extruding from the top surface of the photoresist 128. In other embodiments, the through holes are underfilled (not shown) with conductive materials.

Figure 12D:
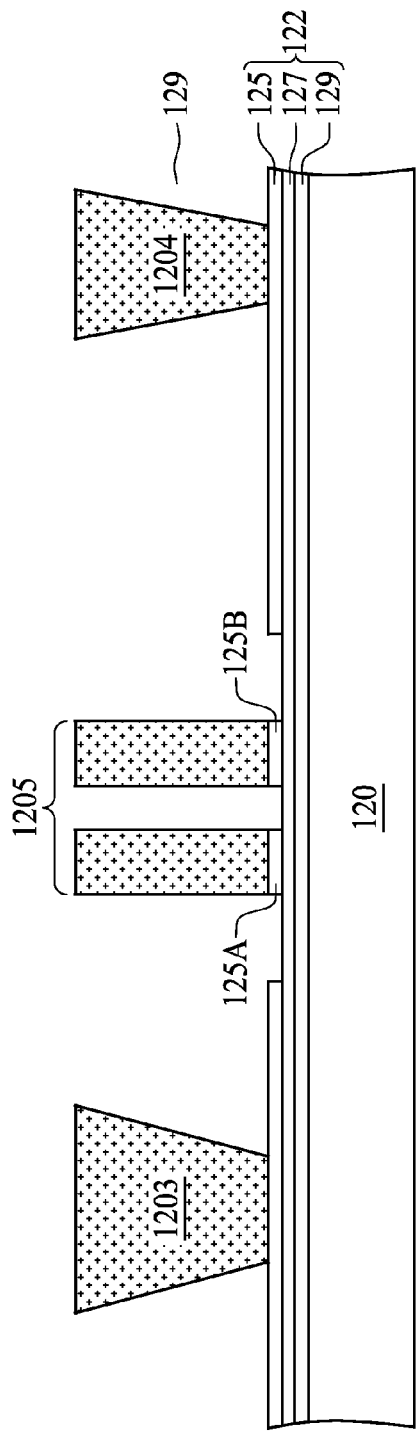

In FIG. 12D, the photoresist 128 in FIG. 12C is removed by an appropriate stripper. The physical contours of the conical conductive post 1203 and the non-conical conductive posts (1204, 1205) are then appeared from the surrounding photoresist 128. In certain embodiments, a longer stripping time is adopted because the confined space shaped by the conductive post 1205 requires an extended stripping session to completely remove the photoresist 128 residue.

Figure 12E:
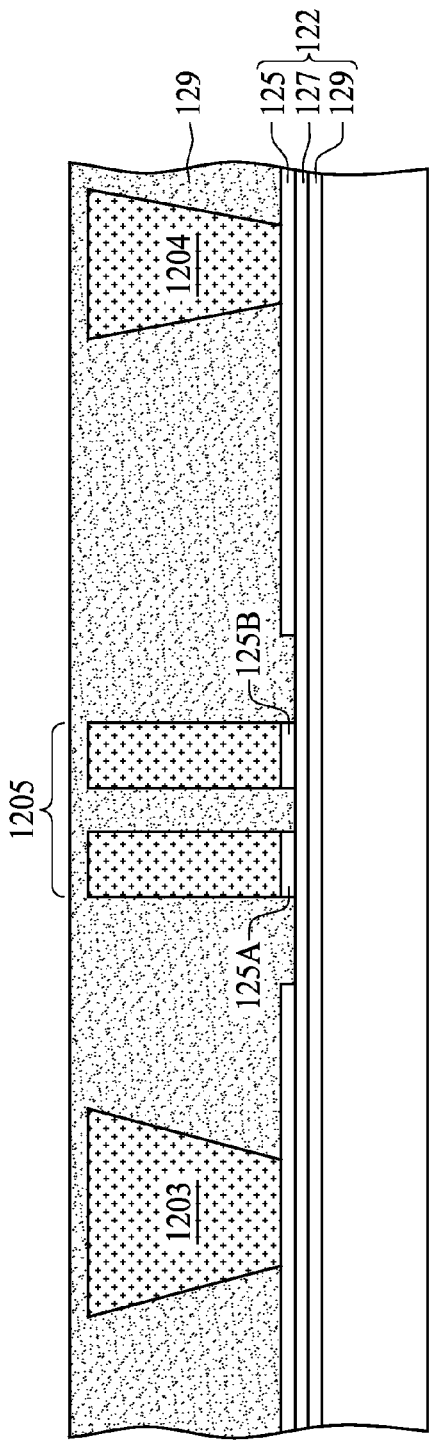

FIG. 12E provides a step of forming a molding compound 129 surrounding the conductive posts 1203, 1204, 1205, and on the carrier 122. In certain embodiments, the molding compound 129 is applied to cover the sidewalls and the top surfaces of the conductive posts 1203, 1204, 1205. In some embodiments, because the molding compound used is opaque, the geometric shape of the conductive posts 1203, 1204, 1205 are not visible after the completion of the operation in FIG. 12E. Note in FIG. 12E, the top surfaces of both the conical and non-conical conductive posts are lower than the top surface of the molding compound 129.

Figure 12F:
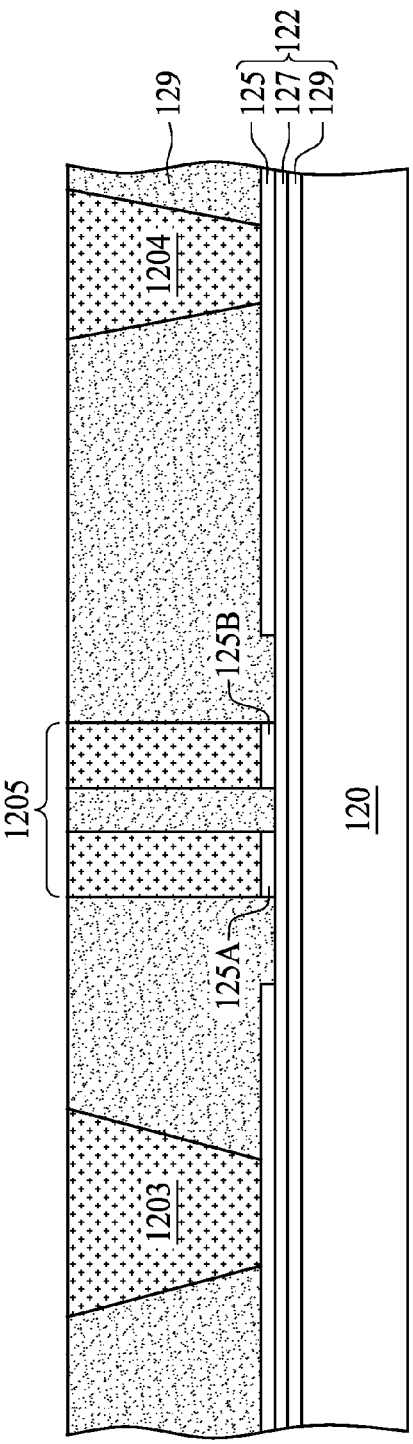

In FIG. 12F, the top surface of the molding compound 129 is further milled to the extent that at least the top surfaces of the conductive posts 1203, 1204, 1205 are exposed. In certain embodiments, the milling process includes a mechanical grinding operation. In other embodiments the milling process is a chemical mechanical polishing (CMP). In certain embodiments, not only the top surface of the molding compound 129 is removed but also the top surfaces of the conductive posts 1203, 1204, 1205 are removed. After the completion of the CMP operation, in FIG. 12F, the top surfaces of the conductive posts 1203, 1204, 1205 are coplanar. In addition, when viewing from the top of the package wafer, the geometric shapes of the conical conductive post 1203 and the non-conical conductive posts 1204, 1205 are visible. In certain embodiments, the exposed top surfaces of the conical conductive post 1203 are distinguishable from that of the non-conical conductive posts 1204 and 1205.

Figure 13A:
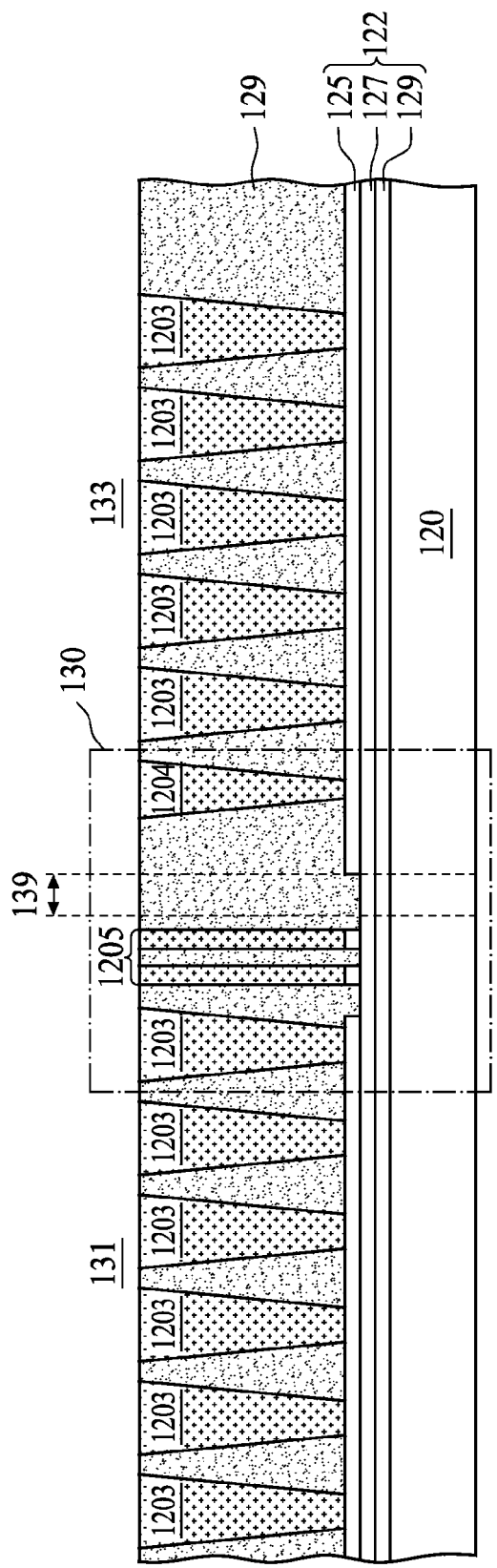
FIG. 13A and FIG. 13B are some of the manufacturing operations used to obtain the semiconductor structure according to some embodiments of the present disclosure.

FIG. 13A is a more extended cross sectional view of the package wafer shown in FIG. 12A to FIG. 12F. Referring to FIG. 12F and FIG. 13A, the area enclosed by the dotted line 130 in FIG. 13A corresponds to the package wafer portion shown in FIG. 12F. A scribe line 139 is located between the alignment mark or second conductive post 1205 and another alignment mark or second conductive post 1204. The scribe line 139 separates a pattern region 131 to its left, and another pattern region 133 to its right. In FIG. 13A, the alignment mark or second conductive posts 1204, 1205 serve the purpose of providing a geometric shape distinguishable from that of the adjacent first conductive posts 1203. In FIG. 13A, the first conductive posts 1203 has a first geometric shape, that is, a conical shape. The alignment mark or second conductive post 1204 and 1205 have second geometric shapes, that are, a triangular shape and a quadrilateral ring, respectively. Hence, from a top view perspective, the first geometric shape is distinguishable from the second geometric shapes In FIG. 13A, the alignment mark or second conductive posts 1204, 1205 placed on the seed layer 125. The alignment mark or second conductive posts 1204, 1205 are either electrically coupled to or insulated from the active structure in the semiconductor substrate 120. The former condition provides two "functional" alignment marks, whereas the latter condition provides two "dummy" alignment marks. In some embodiments, a "functional" or a "dummy" alignment mark cannot be identified by looking at a single cross section of the package. Because whether the layer in contact with the bottom surface of the alignment mark forms an electrical conductive path to the active structure depends on a three dimensional electrical routing design in individual package.

In other embodiments where the alignment mark or second conductive posts 1204, 1205 are positioned directly on the dielectric layer 127, the alignment mark or second conductive posts 1204, 1205 are "dummy" alignment marks.

Figure 13B:
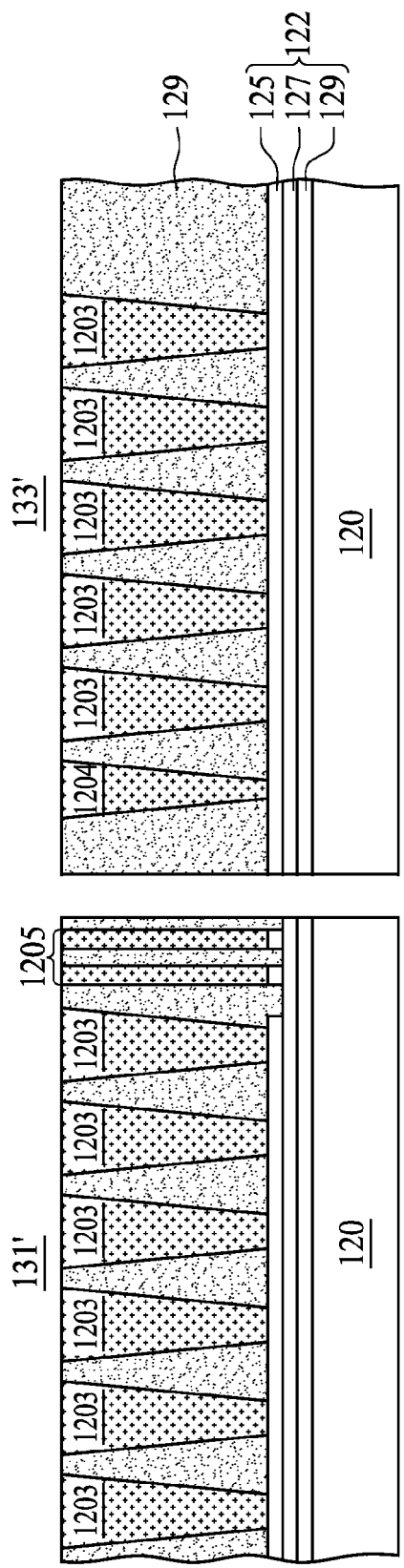

FIG. 13B is a singulation operation conducted on the package wafer. Referring to FIG. 13A and FIG. 13B, the singulation machine cuts through the scribe line 139 and two semiconductor packages 131' and 133' are obtained. Repeating the singulation process described above, a predetermined number of semiconductor packages are obtained.

A singulated semiconductor structure comprises a molding compound; a first conductive post in the molding compound having a first geometric shape in a top view; a second conductive post in the molding compound having a second geometric shape in a top view, wherein the second geometric shape is different from the first geometric shape.

In some embodiments, the first geometric shape is a conical shape, whereas the second geometric shape is any arbitrary geometric construct other than the conical shape, such as, but not limited to, polygons, polygons with sides composed of arcs, combination of arcs and angles less than 360 degrees.

In some embodiments, the second conductive post or alignment mark is positioned at various locations in a package. As a non-limiting example, the second conductive post or alignment mark is positioned at the corner of the package, the center portion of the package, or the periphery of the package. In certain embodiments, the second conductive post or alignment mark is positioned adjacent to the first conductive posts or a conductive post array.

In various embodiments, the second conductive post or alignment mark is positioned at an active area or a non-active area. The second conductive post or alignment mark located at a non-active area is called floating posts or dummy posts.

A singulated semiconductor structure comprises a molding compound; a conductive post array in the molding compound; a conductive alignment mark in the molding compound, wherein the conductive alignment mark has a different geometric shape with a post of the conductive post array, and wherein a top surface the conductive alignment mark and a top surface of a post of the conductive post array are coplanar.

In some embodiments, the first conductive post or a conductive post array has a conical shape in a top view, whereas the second conductive post or alignment mark in a top view has any arbitrary geometric construct other than the conical shape, such as, but not limited to, polygons, polygons with sides composed of arcs, combination of arcs and angles less than 360 degrees. In certain embodiments, the geometric shape of the second conductive post or alignment mark includes more than one conductive feature. In certain embodiments, one second conductive post comprises three conductive features that are all distinguishable from the geometric shape of the first conductive posts or conductive post array.

In some embodiments, from a cross sectional point of view, the second conductive post or alignment mark has a same height with a post of the first conductive posts or conductive post array. However, in certain embodiments, the second conductive post or alignment mark has a height different from that of a post of first conductive posts or conductive post array.

In various embodiments, a post of the first conductive posts or conductive post array is electrically connected to a semiconductor chip underneath. In certain embodiments, a post of the first conductive posts or conductive post array is insulated from a semiconductor chip underneath, and the aforesaid post is called a floating post or a dummy post.

A method of manufacturing a semiconductor structure is provided. The method includes the following steps described in this paragraph. The order of the steps may vary, may be sequential, may overlap, may be in parallel, and combinations thereof. Disposing a photoresist layer on a carrier; forming a conical through hole and a non-conical through hole in the photoresist; filling a conductive material into the conical through hole and the non-conical through hole; removing the photo resist layer to form a conductive conical post and a conductive non-conical post; and forming a molding compound on the conductive material and the carrier.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A singulated semiconductor structure, comprising:
   a molding compound;
   a first conductive post in the molding compound having a first geometric shape in a top view;
   a second conductive post in the molding compound having a second geometric shape in a top view, wherein the second geometric shape is different from the first geometric shape.

2. The semiconductor structure in claim 1, wherein at least one of the second conductive post is located at a non-active area of the singulated semiconductor structure.

3. The semiconductor structure in claim 2, wherein the non-active area is located at a periphery of the singulated semiconductor structure.

4. The semiconductor structure in claim 2, wherein the non-active area is located in a center portion of the singulated semiconductor structure.

5. The semiconductor structure in claim 1, wherein one of the second conductive post is located at a corner of the singulated semiconductor structure.

6. The semiconductor structure in claim 1, wherein the second geometric shape comprises an edge substantially parallel to an edge of the singulated semiconductor structure.

7. The semiconductor structure in claim 1, wherein one of the two different geometric shapes is conical in a top view.

8. The semiconductor structure in claim 1, wherein at least one of the second conductive posts is a dummy post disposed adjacent to at least one of the first conductive posts.

9. The semiconductor structure in claim 1, wherein at least one of the second conductive posts is electrically connected to a semiconductor chip in the singulated semiconductor structure.

10. The semiconductor structure in claim 1, wherein at least one of the second conductive posts is a dummy post disposed on a semiconductor chip in the singulated semiconductor structure.

11. A singulated semiconductor structure, comprising:
a molding compound;
a conductive post array in the molding compound;
a conductive alignment mark in the molding compound, wherein the conductive alignment mark has a geometric shape different from a geometric shape of a post of the conductive post array in a top view, and wherein a top surface the conductive alignment mark and a top surface of a post of the conductive post array are coplanar.

12. The singulated semiconductor structure in claim 11, wherein the geometric shape of the conductive alignment mark includes a polygon.

13. The singulated semiconductor structure in claim 11, wherein the geometric shape of the conductive alignment mark includes at least one curve and one angle less than 360 degrees.

14. The singulated semiconductor structure in claim 11, wherein the conductive alignment mark is adjacent to at least two posts in the conductive post array.

15. The singulated semiconductor structure in claim 11, wherein the conductive alignment mark has a same height with a post in the conductive post array.

16. The singulated semiconductor structure in claim 11, further comprising a second conductive alignment mark having a different geometric shape.

17. The singulated semiconductor structure in claim 11, wherein the conductive alignment mark includes more than one conductive feature.

18. The singulated semiconductor structure in claim 11, wherein the alignment mark is electrically connected to a semiconductor chip in the singulated semiconductor structure.

19. The semiconductor structure in claim 11, wherein the conductive alignment mark is positioned at a non-active area of the singulated semiconductor structure.

20. The semiconductor structure in claim 11, wherein the conductive alignment mark comprises an edge substantially parallel to an edge of the singulated semiconductor structure.

* * * * *